United States Patent
Nishimura et al.

(10) Patent No.: US 12,002,820 B2
(45) Date of Patent: Jun. 4, 2024

(54) ACTIVE MATRIX SUBSTRATE

(71) Applicant: Sharp Kabushiki Kaisha, Sakai (JP)

(72) Inventors: Jun Nishimura, Sakai (JP); Akira Tagawa, Sakai (JP); Yohei Takeuchi, Sakai (JP); Yasuaki Iwase, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 333 days.

(21) Appl. No.: 17/591,042

(22) Filed: Feb. 2, 2022

(65) Prior Publication Data

US 2022/0254814 A1 Aug. 11, 2022

Related U.S. Application Data

(60) Provisional application No. 63/146,291, filed on Feb. 5, 2021.

(51) Int. Cl.
*H01L 27/12* (2006.01)
*H01L 29/786* (2006.01)

(52) U.S. Cl.
CPC ........ *H01L 27/1251* (2013.01); *H01L 27/124* (2013.01); *H01L 29/78633* (2013.01); *H01L 27/1225* (2013.01)

(58) Field of Classification Search
CPC ........... H01L 27/1251; H01L 29/78633; H01L 27/1225; H01L 29/7869; H01L 29/7869; H01L 29/7869; H01L 29/78648; H01L 27/124; H10K 59/126

See application file for complete search history.

(56) References Cited

U.S. PATENT DOCUMENTS

| | | |
|---|---|---|
| 2008/0225024 A1 | 9/2008 | Ito |
| 2012/0138922 A1 | 6/2012 | Yamazaki et al. |
| 2013/0038518 A1 | 2/2013 | Tagawa et al. |
| 2013/0320334 A1 | 12/2013 | Yamazaki et al. |
| 2014/0286076 A1 | 9/2014 | Aoki et al. |

(Continued)

FOREIGN PATENT DOCUMENTS

| | | |
|---|---|---|
| JP | 2006-119404 A | 5/2006 |
| JP | 2008-225036 A | 9/2008 |
| JP | 2012-134475 A | 7/2012 |

(Continued)

*Primary Examiner* — Peter M Albrecht
(74) *Attorney, Agent, or Firm* — Keating & Bennett, LLP

(57) ABSTRACT

An active matrix substrate includes first and second TFTs. The first TFT includes a first lower electrode, a first insulating layer, a first oxide semiconductor layer, and a first gate electrode. The first oxide semiconductor layer includes a first channel region overlapping the first gate electrode when viewed in a normal direction of the substrate. The first lower electrode has a first light-shielding portion overlapping the entire first channel region and including a first metal film. The second TFT includes a second lower electrode, the first insulating layer, a second oxide semiconductor layer, and a second gate electrode. The second oxide semiconductor layer includes a second channel region overlapping the second gate electrode when viewed in the normal direction. The second lower electrode has a light-transmitting portion overlapping the second channel region and including a first transparent conductive film but not a light-shielding metal film.

16 Claims, 16 Drawing Sheets

(56) References Cited

U.S. PATENT DOCUMENTS

2021/0215430 A1     7/2021   Sugimura et al.
2022/0149132 A1*   5/2022   Moon ................ H10K 59/1213

FOREIGN PATENT DOCUMENTS

| JP | 2014-007399 A | 1/2014 |
| JP | 2014-209727 A | 11/2014 |
| JP | 2020-070951 A | 5/2020 |
| JP | 2020-076051 A | 5/2020 |
| WO | 2011/118079 A1 | 9/2011 |

* cited by examiner

FIG. 15

| | |
|---|---|
| STEP 1<br>LOWER ELECTRODE | DEPOSIT FIRST METAL FILM |
| | PHOTOLITHOGRAPHIC PROCESS |
| | ETCH FIRST METAL FILM |
| | DEPOSIT FIRST TRANSPARENT CONDUCTIVE FILM |
| | PHOTOLITHOGRAPHIC PROCESS |
| | ETCH FIRST TRANSPARENT CONDUCTIVE FILM |
| STEP 2<br>LOWER INSULATING LAYER | FORM FIRST INSULATING LAYER |
| STEP 3<br>OXIDE<br>SEMICONDUCTOR LAYER | DEPOSIT OXIDE SEMICONDUCTOR LAYER |
| | PHOTOLITHOGRAPHIC PROCESS |
| | ETCH OXIDE SEMICONDUCTOR LAYER |
| STEP 4<br>GATE INSULATING LAYER<br>GATE METAL LAYER | DEPOSIT GATE INSULATING FILM AND GATE CONDUCTIVE FILM |
| | PHOTOLITHOGRAPHIC PROCESS |
| | ETCH GATE CONDUCTIVE FILM AND GATE INSULATING FILM |
| STEP 5<br>INTERLAYER<br>INSULATING LAYER | DEPOSIT INTERLAYER INSULATING LAYER |
| | PHOTOLITHOGRAPHIC PROCESS |
| | ETCH INTERLAYER INSULATING LAYER |
| STEP 6<br>SOURCE METAL LAYER | DEPOSIT SOURCE CONDUCTIVE FILM |
| | PHOTOLITHOGRAPHIC PROCESS |
| | ETCH SOURCE CONDUCTIVE FILM |
| STEP 7<br>UPPER INSULATING LAYER | DEPOSIT INORGANIC INSULATING LAYER |
| | ORGANIC INSULATING LAYER (PHOTOLITHOGRAPHIC PROCESS) |
| STEP 8<br>COMMON ELECTRODE | DEPOSIT FIRST TRANSPARENT CONDUCTIVE FILM |
| | PHOTOLITHOGRAPHIC PROCESS |
| | ETCH FIRST TRANSPARENT CONDUCTIVE FILM |
| STEP 9<br>DIELECTRIC LAYER | DEPOSIT DIELECTRIC LAYER |
| | PHOTOLITHOGRAPHIC PROCESS |
| | ETCH DIELECTRIC LAYER/INORGANIC INSULATING LAYER |
| STEP 10<br>PIXEL ELECTRODE | DEPOSIT SECOND TRANSPARENT CONDUCTIVE FILM |
| | PHOTOLITHOGRAPHIC PROCESS |
| | ETCH SECOND TRANSPARENT CONDUCTIVE FILM |

ACTIVE MATRIX SUBSTRATE

BACKGROUND

1. Field

The present disclosure relates to an active matrix substrate.

2. Description of the Related Art

An active matrix substrate used in a display device includes a display region that includes multiple pixel regions and a non-display region (also referred to as a "frame region" or a "peripheral region") other than the display region. A pixel region is a region that corresponds to a pixel of a display device. Each of the pixel regions is equipped with a thin film transistor (hereinafter also referred to as a "TFT") that serves as a switching element.

In recent years, use of oxide semiconductors instead of amorphous silicon and polycrystalline silicon as the material for active layers of TFTs has been proposed. Such TFTs are referred to as "oxide semiconductor TFTs". Oxide semiconductors have higher mobility than amorphous silicon. Thus, oxide semiconductor TFTs can operate with higher speed than amorphous silicon TFTs. Moreover, since oxide semiconductor films are formed by a simpler process than polycrystalline silicon films, oxide semiconductor films can be applied also to a device that has a large area.

In some cases, driving circuits such as gate drivers are monolithically (integrally) formed in a non-display region of an active matrix substrate. In addition, it has been proposed that, for a device, such as a smart phone, that strongly demands a narrower frame, not only gate drivers but also demultiplexer circuits such as source shared driving (SSD) circuits be monolithically formed. A SSD circuit is a circuit that distributes a display signal to multiple source bus lines from one video signal line from each terminal of a source driver. When a SSD circuit is mounted, a region (terminal unit-forming region) where terminal units are disposed in the non-display region can be further narrowed. Moreover, since the number of outputs from the source drivers decreases and the circuit scale can be reduced, the cost of the driver ICs can be reduced.

A peripheral circuit, such as a driving circuit or a SSD circuit, includes TFTs. In this description, a TFT that serves as a switching element disposed in each pixel of a display region is referred to as a "pixel TFT", and a TFT that constitutes a peripheral circuit is referred to as a "circuit TFT". Moreover, of circuit TFTs, those TFTs that are used as switching elements in a SSD circuit are referred to as "SSD circuit TFTs" and those that are used in gate driver circuits are referred to as "gate driver circuit TFTs".

Many of oxide semiconductor TFTs are bottom-gate TFTs; however, there have been proposals of top-gate oxide semiconductor TFTs. For example, Japanese Unexamined Patent Application Publication No. 2020-076051 discloses a top-gate TFT in which a gate electrode is disposed on one portion of an oxide semiconductor layer with a gate insulating layer therebetween. On a substrate side of the oxide semiconductor layer, a light-shielding layer (light-shielding wire) for protecting a portion of the oxide semiconductor layer that serves as a channel from backlight light is disposed.

Some of circuit TFTs (for example, SSD circuit TFTs) are required to enable a large ON-state current to flow therein and have a small driving load. Thus, a top-gate structure may be employed in these TFTs. By using a light-shielding layer of a SSD circuit TFT as a lower gate electrode, the ON-state current can be further increased. Note that, in this case, from the viewpoint of the production process, the same oxide semiconductor films as those for the SSD circuit TFTs may be used in other TFTs, such as pixel TFTs, that are formed on the same substrate, and the same top-gate structure may be employed.

However, the investigations conducted by the inventors of the present disclosure have revealed that, when top-gate oxide semiconductor TFTs that have the same structure are used as pixel TFTs and circuit TFTs (for example, SSD circuit TFTs), variation in characteristics among TFTs after deterioration has occurred due to driving of the active matrix substrate increases. A possible reason behind this is that the duty ratio of the driving signal applied to the gate differs between the pixel TFTs and the SSD circuit TFTs, and this leads to deterioration phenomena (the threshold voltage shift direction, the shift amount, etc.) different from one another. The deterioration phenomena are described in detail below.

Thus, when multiple oxide semiconductor TFTs having different driving signal duty ratios are formed on the same substrate, it is difficult to sufficiently suppress deterioration of characteristics and extend the lifetime of all TFTs, and there is a possibility that the reliability of the active matrix substrate would be degraded.

One embodiment of the present disclosure aims to improve reliability of an active matrix substrate equipped with multiple oxide semiconductor TFTs by suppressing the variation in characteristics among TFTs caused by deterioration.

SUMMARY

According to an aspect of the disclosure, there is provided an active matrix substrate including a substrate and a plurality of oxide semiconductor TFTs supported on the substrate, wherein the plurality of oxide semiconductor TFTs include a plurality of first TFTs and a plurality of second TFTs, each of the first TFTs includes a first lower electrode, a first insulating layer that covers the first lower electrode, a first oxide semiconductor layer disposed on the first insulating layer, and a first gate electrode disposed on a portion of the first oxide semiconductor layer with a first gate insulating layer therebetween, in each of the first TFTs, the first oxide semiconductor layer includes a first channel region that overlaps the first gate electrode when viewed in a normal direction of the substrate, and the first lower electrode has a first light-shielding portion that overlaps an entirety of the first channel region when viewed in the normal direction of the substrate, and the first light-shielding portion includes a first metal film, each of the second TFTs includes a second lower electrode, the first insulating layer that is extended to cover the second lower electrode, a second oxide semiconductor layer disposed on the first insulating layer, and a second gate electrode disposed on a portion of the second oxide semiconductor layer with a second gate insulating layer therebetween, and, in each of the second TFTs, the second oxide semiconductor layer includes a second channel region that overlaps the second gate electrode when viewed in the normal direction of the substrate, and the second lower electrode has a light-transmitting portion that overlaps at least a portion of the second channel region when viewed in the normal direction of the substrate, and the light-transmitting portion includes a first transparent conductive film but not a light-shielding metal film.

BRIEF DESCRIPTION OF THE DRAWINGS

FIG. 15 is a chart illustrating the process flow of one example of a method for producing the active matrix substrate.

DESCRIPTION OF THE EMBODIMENTS

Figure 1:
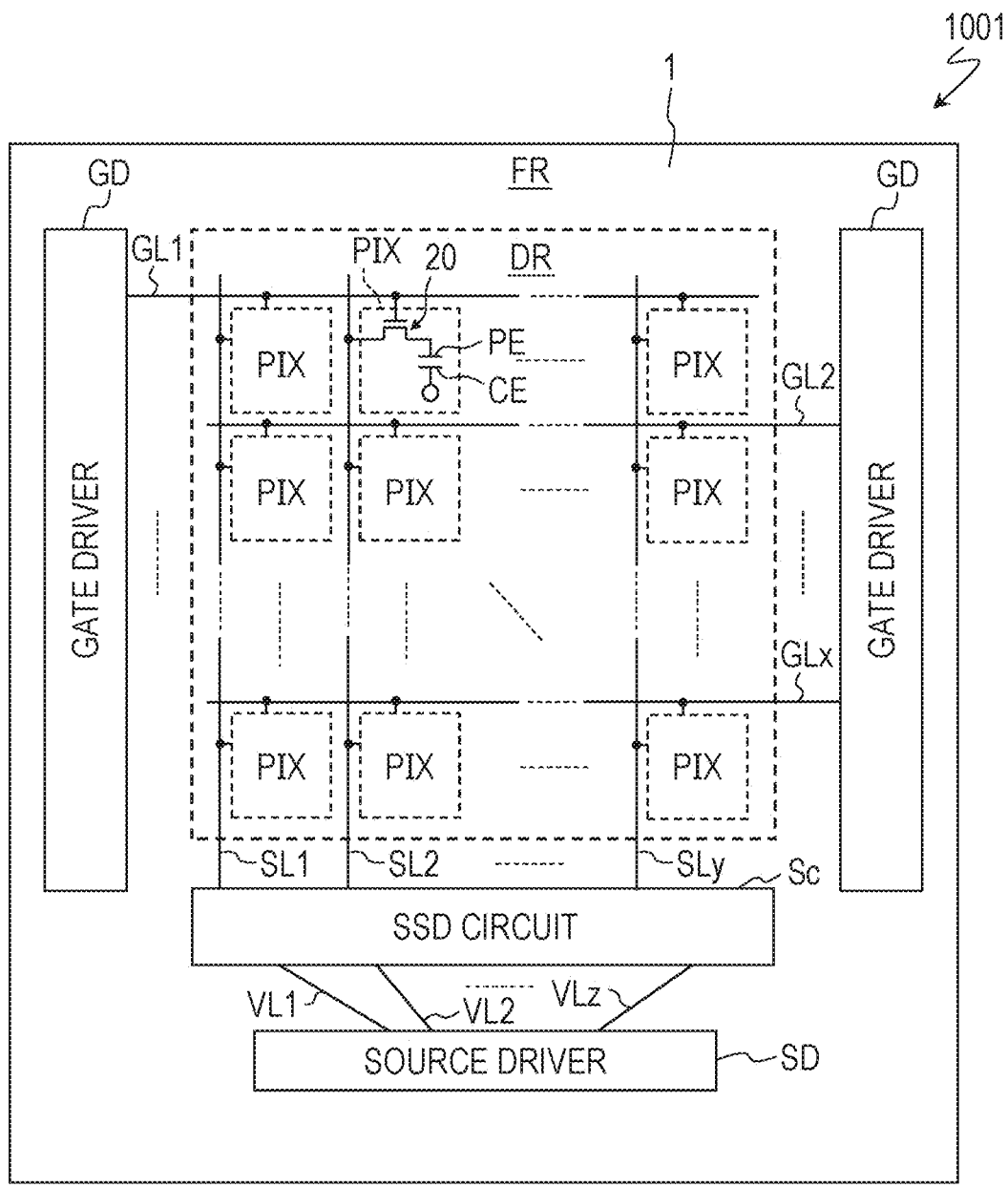
FIG. 1 is a schematic diagram illustrating one example of a planar structure of an active matrix substrate.

Hereinafter, the findings of the inventors of the present disclosure are described.

Deterioration of top-gate oxide semiconductor TFTs is dependent on the voltage applied to the gate, the time voltage is applied to the gate, whether there is incident light on a channel region of an oxide semiconductor layer, etc. In other words, in top-gate oxide semiconductor TFTs, the deterioration phenomena caused by the gate bias stress notably change depending on the driving signal applied to the gate and whether there is a light-shielding layer that shields the channel region from light. Here, the deterioration phenomena include the direction in which the threshold voltage of TFTs shifts (a shift toward the positive voltage side is referred to as a "plus shift" and a shift toward the negative voltage side is referred to as a "minus shift"), and the shift amount of the threshold voltage. Moreover, the "channel region" refers to a region of an oxide semiconductor layer that serves as an active layer, the region overlapping the gate (top gate) when viewed in the normal direction of the substrate.

Table 1 shows one example of the stress characteristics of oxide semiconductor TFTs. Here, the relationships among the gate application voltage (positive and negative biases), whether there is incident light on the channel region, and the threshold voltage shift caused by the gate bias stress are shown.

TABLE 1

| Voltage applied to gate | Incident light on channel | Stress-induced change in threshold voltage |
| --- | --- | --- |
| Plus bias | Yes | Plus shift |
|  | No | Plus shift |
| Minus bias | Yes | Minus shift |
|  | No | Slight minus shift |

As indicated in Table 1, when a plus bias is applied to a gate of an oxide semiconductor TFT for a predetermined time, the threshold voltage shifts toward the plus side depending on the gate bias stress irrespective of whether there is incident light on the channel region.

Meanwhile, when a minus bias is applied to a gate of an oxide semiconductor TFT for a predetermined time while light is incident on the channel region, the threshold voltage shifts toward the minus side. This is possibly due to the increase in oxygen deficiencies in the oxide semiconductor caused by light incident on the channel region of the oxide semiconductor layer and the resulting decrease in resistance. In this description, the deterioration caused by light incident on the oxide semiconductor layer may also be referred to as "photo deterioration".

However, when a minus bias is applied to the gate of an oxide semiconductor TFT for a predetermined time while light is not incident on the channel region, the threshold voltage shifts toward the minus side but only in a small amount. This indicates that decreasing the amount of light incident on the channel region by providing, for example, a light-shielding layer can suppress the minus shift of the threshold voltage caused by photo deterioration.

As mentioned above, in an active matrix substrate, typically, multiple TFTs in which the driving signal applied to the gate is different from one another are formed on the same substrate. In these TFTs, the element deterioration phenomena that pose issues can be different depending on the driving signal. As can be understood from Table 1, in TFTs in which the ratio of the time for which a minus bias is applied to the gate is large (in other words, the off-duty of the driving signal applied to the gate is large), the minus shift of the threshold voltage caused by photo deterioration increases. In contrast, in TFTs in which the ratio of the time for which a plus bias is applied to the gate is large (in other words, the on-duty of the driving signal applied to the gate is large), the plus shift of the threshold voltage increases.

In this description, the on-duty of the driving signal is simply referred to as a "duty ratio". A duty ratio is a fraction of the time for which the driving signal applied to the gate remains high in one period (here, one horizontal scan period). In other words, in a TFT to which a driving signal with a high duty ratio is supplied, the ratio of the ON-state period relative to one horizontal scan period is large. Note that one horizontal scan period (1H) refers to the time taken until a next pixel row is selected after one pixel row is selected in a line sequential scanning. The time taken for a particular row selected once to be selected again is referred to as a vertical scan period (1V) or a frame.

Figure 12:
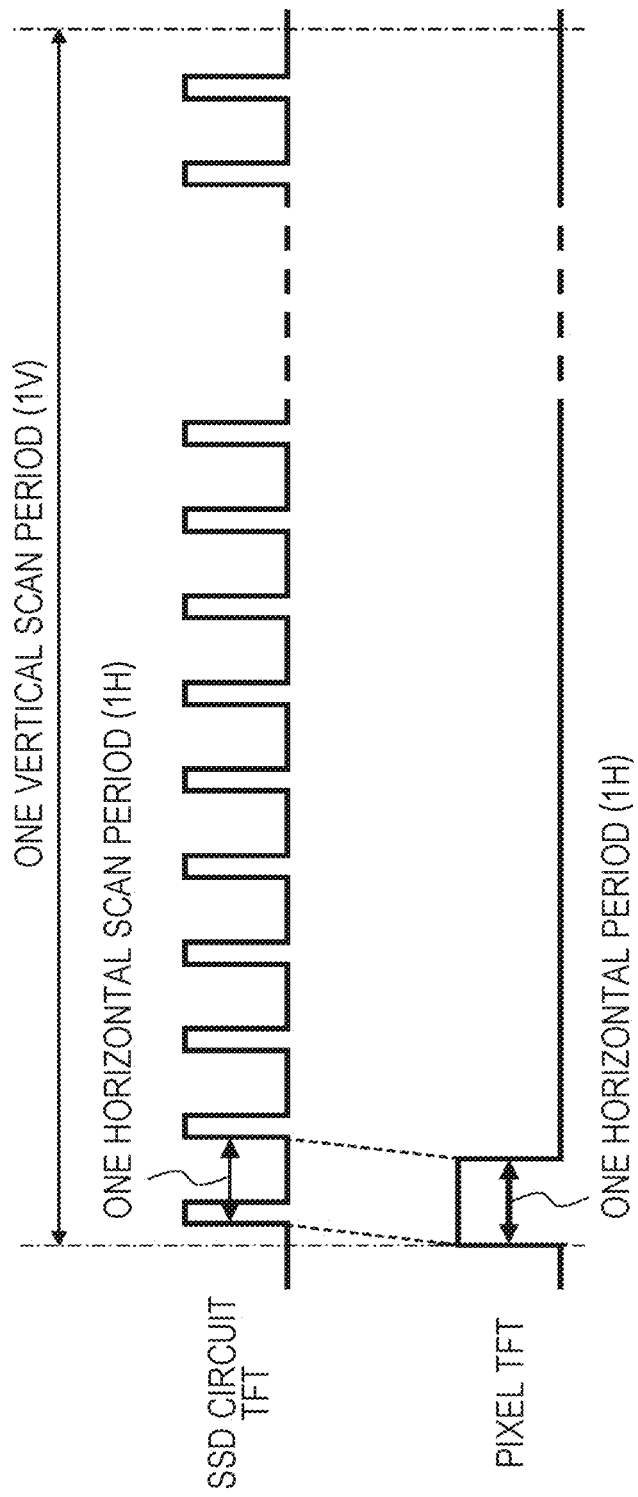
FIG. 12 is a diagram illustrating, as an example, the timing chart of a driving signal (SSD control signal) applied to the SSD circuit TFT and a driving signal (scan signal) applied to the pixel electrode.

As one example, as illustrated in FIG. 12, a driving signal having a relatively low duty ratio (small OFF-duty) is applied to the gate of a pixel TFT. The duty ratio is, for example, less than 1%. Thus, the issue with the pixel TFTs is the minus shift of the threshold voltage. In contrast, a driving signal having a relatively high duty ratio (large on-duty) is applied to the gate of a SSD circuit TFT. The duty ratio is, for example, about 35% or about 50%. Thus, in a SSD circuit TFT, the duty ratio of the driving signal is several hundred times larger than that of the pixel TFT, and, compared with the pixel TFT, the plus shift of the threshold voltage caused by driving of the active matrix substrate is large.

As described above, the deterioration phenomena of the TFTs to be addressed differ according to the duty ratio of the driving signal. Thus, it has been difficult to simultaneously suppress deterioration of characteristics and extend the lifetime of multiple TFTs involving different duty ratios.

To address this, the inventors of the present application have found that the characteristics of the respective TFTs can be simultaneously optimized by changing the TFT structure (in particular, the light-shielding structure for the channel region) depending on the duty ratio of the driving signal. In particular, for a TFT (for example, a pixel TFT) in which the duty ratio of the driving signal is small, a light-shielding layer is provided to suppress minus shift of the threshold voltage. Meanwhile, for a TFT (for example, a SSD circuit TFT) in which the duty ratio of the driving signal is large, a particular amount of backlight light is intentionally made incident on the channel region to induce photo deterioration. As a result, all or part of the shift amount of the threshold voltage toward the plus direction can be canceled out by the shift amount of the threshold voltage toward the minus direction due to the photo deterioration, and thus, the plus shift of the threshold voltage can be suppressed. In this description, the effect that utilizes the minus shift of the threshold voltage that occurs during application of a minus bias and is caused by photo deterioration is referred to as a "threshold voltage minus shift effect" (or simply "minus shift effect").

Here, in order to make a particular amount of light incident on the channel region of a TFT (for example, a SSD circuit TFT) in which the duty ratio of the driving signal is large, a structure that does not provide a light-shielding layer on a substrate side of the oxide semiconductor layer is conceivable. In this manner, the plus shift of the threshold voltage is suppressed by utilizing the minus shift effect caused by the photo deterioration. However, since the light-shielding layer can no longer function as a lower gate electrode, the TFT performance (mobility) per unit area decreases, and, there is a possibility that the desired ON-state current cannot be obtained. Alternatively, a structure in which a light-shielding layer that shields only one portion of the channel region is provided to function as a lower gate electrode is also conceivable.

However, since the area of the lower gate electrode relative to the channel region is small, sufficient TFT performance may not always be obtained.

The inventors of the present application have examined the findings described above and, as a result, have found that, in a TFT to which a driving signal with a large duty ratio is applied, the plus shift of the threshold voltage can be suppressed while ensuring high mobility by providing a transparent lower electrode formed of a transparent conductive film on a substrate side of the channel region. According to this TFT structure, the backlight light is incident on the channel region without being shielded by the transparent lower electrode, and thus, the plus shift of the threshold voltage can be suppressed by utilizing the minus shift effect caused by the photo deterioration. Moreover, since the transparent lower electrode functions as a lower gate electrode, the ON-state current can be further increased.

Meanwhile, in a TFT to which a driving signal with a small duty ratio is applied, a light-shielding lower electrode formed of a metal film is provided on the substrate side of the channel region. Since the light-shielding lower electrode functions as a light-shielding layer that suppresses backlight light incident on the channel region, the minus shift of the threshold voltage can be suppressed. Moreover, since the light-shielding electrode also functions as a lower gate electrode, the mobility can be increased.

The relationship among the duty ratio of the driving signal, the structure of the lower electrode of the TFT, the stress resistance of the TFT, and the mobility is shown in Table 2 as examples.

TABLE 2

| Example of usage | On-duty (duty ratio) | Off-duty | Structure of lower electrode | Light-shielding of channel region | Stress resistance (threshold voltage shift) | Mobility |
|---|---|---|---|---|---|---|
| Pixel TFT | 0.1% | 99.9% | Metal film | Yes (metal film) | Minus shift/small | High |
| | | | Transparent conductive film | No | Minus shift/large | High |
| | | | No lower electrode | No | Minus shift/large | Low |
| SSD circuit TFT | 33% | 67% | Metal film | Yes (metal film) | Plus shift/large | High |
| | | | Transparent conductive film | No | Plus shift/small | High |
| | | | No lower electrode | No | Plus shift/small | Low |

Table 2 indicates that when a light-shielding lower electrode formed of a metal film is formed in a TFT (for example, a pixel TFT) in which the duty ratio of the driving signal is small and when a transparent lower electrode formed of a transparent conductive film is formed in a TFT (for example, a SSD circuit TFT) in which the duty ratio of the driving signal is large, the reliability can be improved by suppressing deterioration of characteristics while maintaining high mobility for all of the TFTs.

According to one embodiment of the present disclosure, some of the multiple oxide semiconductor TFTs formed on the active matrix substrate have lower electrodes that include light-shielding portions. A light-shielding portion of a lower electrode overlaps the entire channel region when viewed in the normal direction of the substrate. The lower electrode is to include a metal film and may further include a transparent conductive film. In this description, the TFT structure equipped with a lower electrode that has a light-shielding portion overlapping the entirety of the channel region when viewed in the normal direction of the substrate is referred to as a "light-shielding structure", and a TFT that has the light-shielding structure is referred to as a "first TFT". Meanwhile, some of other TFTs of the multiple oxide semiconductor TFTs include a lower electrode that includes a light-transmitting portion that at least partly overlap the channel region when viewed in the normal direction of the substrate. The light-transmitting portion includes a transparent conductive film but does not include a light-shielding metal film. Such a lower electrode may be a transparent electrode, or may include a metal film in a portion other than the light-transmitting portion. As such, the TFT structure equipped with a lower electrode that has a light-transmitting portion overlapping the entirety or a portion of the channel region when viewed in the normal direction of the substrate is referred to as a "non-light-shielding structure", and a TFT that has the non-light-shielding structure is referred to as a "second TFT".

According to an embodiment of the present disclosure, multiple oxide semiconductor TFTs formed on the active matrix substrate are to include at least a first TFT that has a light-shielding structure and a second TFT that has a non-light-shielding structure, and may further include a TFT that has a structure other than these. The usage of each of the TFTs is not limited. The first TFT is not limited to a pixel TFT, and may be, for example, a gate driver circuit TFT that constitutes a gate driver. In addition, the second TFT is not limited to a SSD circuit TFT and may be an oscillation-preventing transistor, which is one of gate driver circuit TFTs.

In the description above, an example in which the TFT structure is optimized depending on the duty ratio of the driving signal has been described; however, according to an embodiment of the present disclosure, a TFT structure can be appropriately selected for each of the TFTs from the viewpoint of the characteristics required for each TFT and the viewpoint of the production process. For example, a TFT required to have less leakage current may employ a light-shielding structure, and a TFT required to have high ON-state current may employ a non-light-shielding structure.

First Embodiment

Hereinafter, an active matrix substrate of a first embodiment is described with reference to the drawings.

FIG. 1 is a schematic diagram illustrating one example of a planar structure of an active matrix substrate 1001. The active matrix substrate 1001 has a display region DR that contributes to displaying and a peripheral region (frame region) FR positioned outside the display region DR. The display region DR includes multiple pixel regions PIX arranged into a matrix. A pixel region PIX (may be simply referred to as a "pixel") is a region that corresponds to a pixel of a display device. The non-display region FR is positioned in the periphery of the display region DR and does not contribute to displaying.

The active matrix substrate 1001 is equipped with, in a display region DR, a substrate 1, multiple pixel TFTs 20 supported on the substrate 1, multiple pixel electrodes PE, multiple gate bus lines GL1 to GLx (x is an integer of 2 or more, hereinafter, may be collectively referred to as "gate bus lines GL") that supply gate signals to the pixel TFTs 20, and multiple source bus lines SL1 to SLy (y is an integer of 2 or more, hereinafter, may be collectively referred to as "source bus lines SL") that supply source signals to the pixel TFTs 20. Each of the pixel regions PIX is defined by, for example, a gate bus line GL and a source bus line SL. A source bus line SL extends in a direction that intersects a gate bus line GL.

Each pixel TFT 20 and each pixel electrode PE are disposed to correspond to one of the multiple pixel regions PIX. The gate electrode of a pixel TFT 20 is electrically connected ton one of the gate bus lines GL, and the source electrode is electrically connected to one of the source bus lines SL. The drain electrode is electrically connected to a pixel electrode PE.

When the active matrix substrate 1001 is applied to a display device of a horizontal field mode, such as fringe field switching (FFS) mode, an electrode (common electrode) CE common to the multiple pixels PIX is formed on the active matrix substrate 1001.

Peripheral circuits such as drivers can be formed in the non-display region FR. For example, gate drivers GD that drive the gate bus lines GL and a SSD circuit Sc that drives the source bus lines SL in a time-sharing manner may be monolithically formed. The SSD circuit Sc is connected to a source driver SD that is mounted by, for example, a chip-on-glass (COG) process. The peripheral circuits such as the SSD circuit and the gate driver circuits each include multiple circuit TFTs.

The SSD circuit Sc is disposed between the source driver SD and the display region DR. The source driver SD includes multiple output terminals (not illustrated). In a region positioned between the source driver SD and the SSD circuit Sc, multiple signal output lines (video signal lines) VL1 to VLz (z is an integer of 2 or more, hereinafter collectively referred to as "signal output lines VL") are provided. The SSD circuit Sc distributes a display signal V supplied from one signal output line VL to two or more source bus lines SL (z<y). In this manner, the number of output terminals (output pins) of the source driver SD can be reduced, and thus the area of the non-display region FR can be reduced (frame narrowing).

Although not illustrated in the drawing, an active matrix substrate 1000 may be equipped with multipole touch sensor electrodes and multiple touch lines for driving and/or detecting touch sensors.

Such an active matrix substrate is applied to, for example, an in-cell touch panel-type display device. An in-cell touch panel-type display device may have built-in touch sensors of a self capacitance type or may have built-in touch sensors of a mutual capacitance type.

Structure of Oxide Semiconductor TFTs

The active matrix substrate of this embodiment is equipped with multiple oxide semiconductor TFTs that have a top-gate structure. The multiple oxide semiconductor TFTs include a first TFT that has a light-shielding lower electrode and a second TFT that has a transparent lower electrode.

The active matrix substrate of this embodiment includes multiple first TFTs and multiple second TFTs; however, here, one first TFT and one second TFT are illustrated in the drawings and the structures thereof are explained.

Figure 2A:
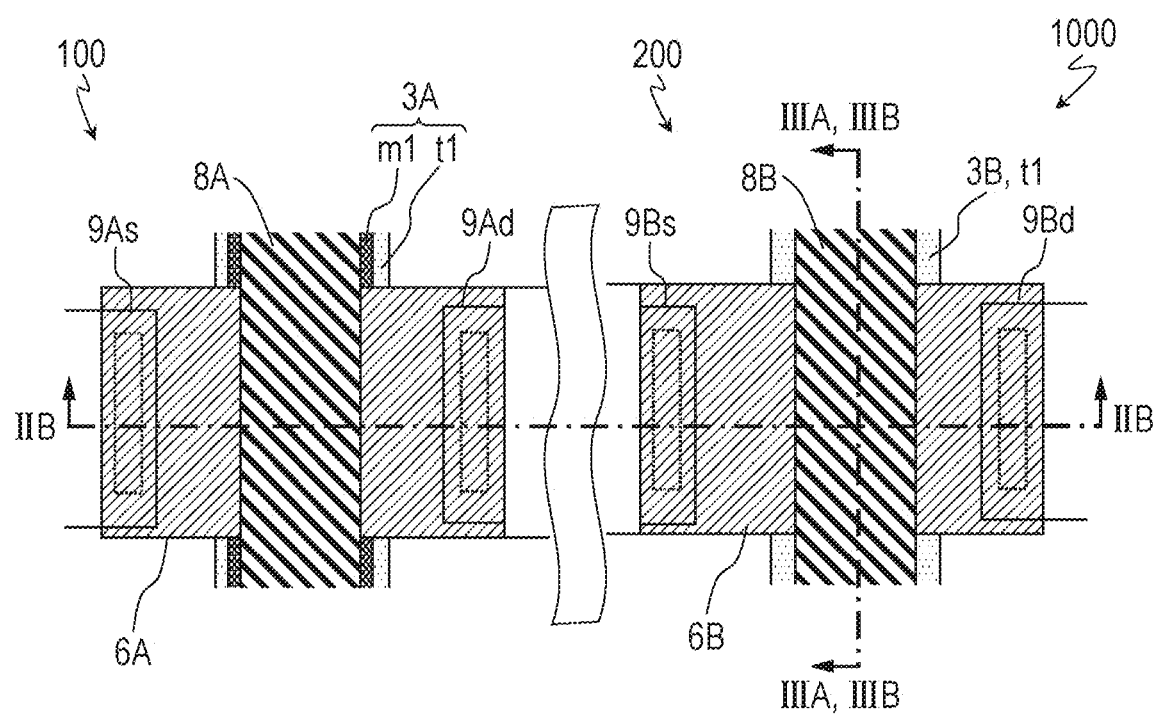
FIG. 2A is a plan view illustrating a first TFT and a second TFT of the active matrix substrate as one example.
Figure 2B:
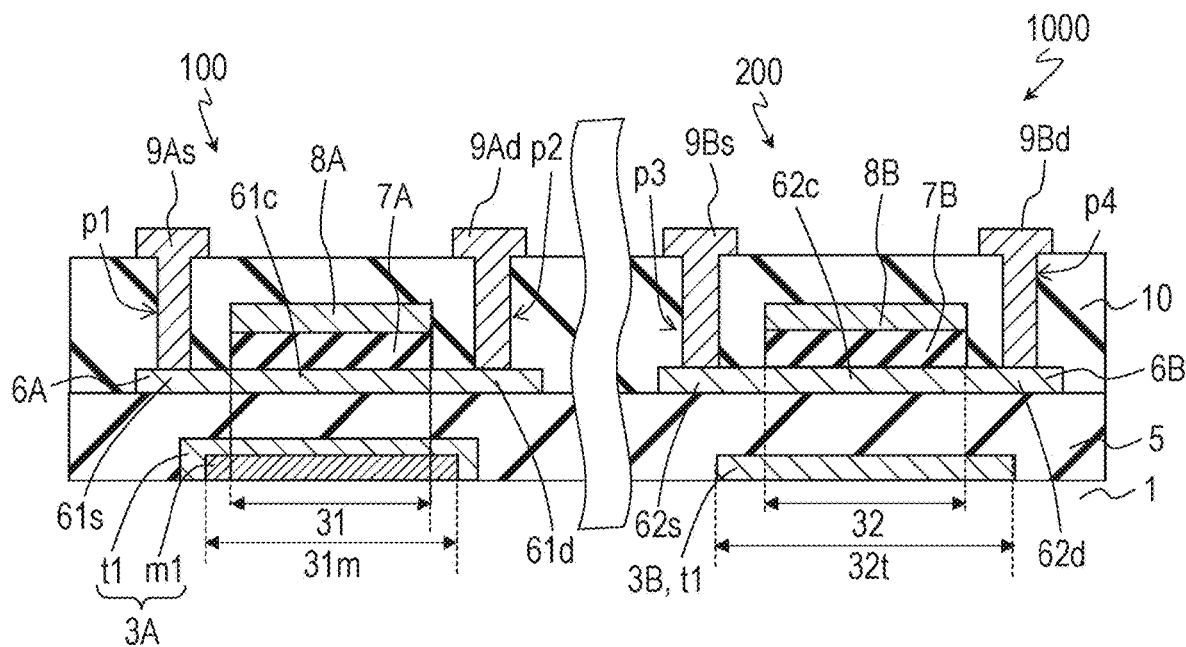
FIG. 2B is a cross-sectional view taken along line IIB-IIB in FIG. 2A.

FIGS. 2A and 2B are, respectively, a schematic plan view and a schematic cross-sectional view illustrating examples of a first TFT 100 and a second TFT 200. FIG. 2B illustrates a cross section taken along line IIB-IIB in FIG. 2A.

First TFT 100

The first TFT 100 is supported on a substrate 1, and is a top-gate TFT that has an oxide semiconductor layer 6A as an active layer.

The first TFT 100 has a lower electrode (first lower electrode) 3A disposed on the substrate 1, an oxide semiconductor layer (first oxide semiconductor layer) 6A disposed on the lower electrode 3A with a first insulating layer 5 therebetween, a gate insulating layer (first gate insulating layer) 7A disposed on the oxide semiconductor layer 6A, a gate electrode (first gate electrode) 8A disposed on the gate insulating layer 7A, a source electrode (first source electrode) 9As, and a drain electrode (first drain electrode) 9Ad.

When viewed in the normal direction of the main surface of the substrate 1, the oxide semiconductor layer 6A has a channel region 61c, and first and second regions that flank the channel region 61c.

The first and second regions are low-resistance regions in which the resistivity thereof is lower than that of the channel region 61c. The first and second regions may be conductor regions. A portion 61s of the first region is electrically connected to a source electrode 9As. A portion 61d of the second region is electrically connected to a drain electrode 9Ad. In this description, in the first region, the region 61s electrically connected to the source electrode 9As is referred to as a "source contact region", and, in the second region, the region 61d electrically connected to the drain electrode 9Ad is referred to as a "drain contact region". In addition, the "channel region 61c" refers to a region that overlaps the gate electrode 8A and that is positioned between the source contact region 61s and the drain contact region 61d when viewed in the normal direction of the substrate 1.

The lower electrode 3A is positioned between the substrate 1 and the first insulating layer 5. The lower electrode 3A includes a region (referred to as an "overlapping region") 31 that overlaps the channel region 61c when viewed in the normal direction of the substrate 1.

The lower electrode 3A has a light-shielding portion (may also be referred to as a "first light-shielding portion") 31m that includes a first metal film m1. The first metal film m1 may be any light-shielding metal film, and may be a single-layer or multilayer film. The light-shielding portion 31m is arranged to overlap the entire channel region 61c when viewed in the normal direction of the substrate 1. In other words, the entirety of the overlapping region 31 of the lower electrode 3A is the light-shielding portion 31m. In this manner, the minus shift of the threshold voltage caused by photo deterioration can be more effectively suppressed. When viewed in the normal direction of the substrate 1, the light-shielding portion 31m may overlap a portion of or the entirety of the regions (referred to as "intermediate regions") of the oxide semiconductor layer 6A positioned between the channel region 61c and the source contact region 61s and between the channel region 61c and the drain contact region 61d. The amount of light incident on the channel region 61c can be more effectively reduced by also shielding the intermediate regions from light.

In the example illustrated in the drawings, the lower electrode 3A has a multilayer structure that includes the first metal film m1 and the first transparent conductive film t1 that has a light-transmitting property. The light-shielding portion 31m is defined by the first metal film m1. Here, the first transparent conductive film t1 is disposed on the first metal film m1. The first transparent conductive film t1 may cover an upper surface and side surfaces of the first metal film m1.

Figure 2C:
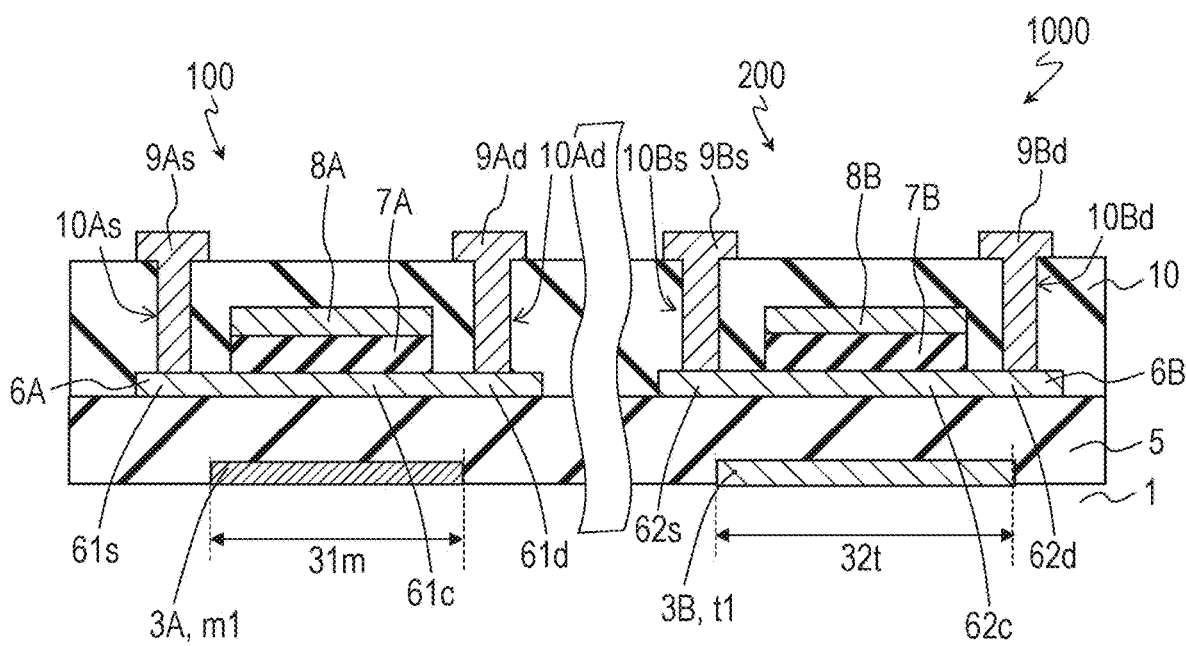
FIG. 2C is a cross-sectional view illustrating another example of the first TFT and the second TFT.

As illustrated in FIG. 2C, the lower electrode 3A may include only a metal layer (first metal film m1) and may not include a transparent conductive film. In other words, the entirety of the lower electrode 3A may be the light-shielding portion 31m.

The lower electrode 3A may be fixed to the fixed potential (for example, a source potential) or may be in an electrically floating state. Alternatively, the lower electrode 3A may serve as a lower gate electrode of the first TFT 100. For example, the lower electrode 3A may be electrically connected to the gate electrode 8A.

The gate insulating layer 7A is arranged, for example, to cover a portion (at least the channel region 61c) of the oxide semiconductor layer 6A but not the source contact region 61s or the drain contact region 61d. The gate insulating layer 7A may be positioned only between the oxide semiconductor layer 6A and the gate electrode 8A. The edge (the edge of the upper surface of the gate insulating layer 7A if the gate insulating layer 7A has a tapered shape) of the gate insulating layer 7A may align with the edge of the gate electrode 8A when viewed in the normal direction of the substrate 1. Such a structure is obtained by performing patterning on the gate insulating layer 7A by using a mask for patterning the gate electrode 8A or by using the gate electrode 8A as a mask.

The gate electrode 8A is, for example, formed by using the same conductive film (gate conductive film) as the gate bus lines GL. In this description, a layer that includes electrodes and wires formed by using a gate conductive film is referred to as a "gate metal layer".

The oxide semiconductor layer 6A, the gate insulating layer 7A, and the gate electrode 8A are covered with an interlayer insulating layer 10. As the interlayer insulating layer 10, a reducing insulating film (for example, a silicon nitride film) capable of reducing the oxide semiconductor may be used. As a result, the increase in the specific resistivity of a portion of the oxide semiconductor layer 6A in contact with the interlayer insulating layer 10 can be suppressed. The interlayer insulating layer 10 has, formed therein, a source opening p1 that exposes the source contact region 61s and a drain opening p2 that exposes the drain contact region 61d.

A source electrode 9As is formed on the interlayer insulating layer 10 and in the source opening p1, and is connected to the source contact region 61s of the oxide semiconductor layer 6A in the source opening p1. The drain electrode 9Ad is formed on the interlayer insulating layer 10 and in the drain opening p2, and is connected to the drain contact region 61d of the oxide semiconductor layer 6A in the drain opening p2. The source electrode 9As and the drain electrode 9Ad may be formed by using the same conductive film as the source bus lines SL. In this description, a layer that includes electrodes and wires formed by using a source conductive film is referred to as a "source metal layer".

When the first TFT 100 is used as a pixel TFT (FIG. 1), the gate electrode 8A is electrically connected to a corresponding gate bus line GL, and the source electrode 9As is electrically connected to a corresponding source bus line SL.

The drain electrode 9Ad is electrically connected to a corresponding pixel electrode PE.

Second TFT 200

The second TFT 200 is supported on the substrate 1 as with the first TFT 100, and is a top-gate TFT that has, as an active layer, an oxide semiconductor layer 6B. The second TFT 200 is different from the first TFT 100 in that the lower electrode 3B has a light-transmitting portion 32t. Other features may be the same as those of the first TFT 100. The descriptions of the same features as those of the first TFT 100 may be omitted.

The second TFT 200 has a lower electrode (second lower electrode) 3B disposed on the substrate 1, an oxide semiconductor layer (second oxide semiconductor layer) 6B disposed on the lower electrode 3B with the first insulating layer 5 therebetween, a gate insulating layer (second gate insulating layer) 7B disposed on the oxide semiconductor layer 6B, a gate electrode (second gate electrode) 8B disposed on the gate insulating layer 7B, a source electrode (second source electrode) 9Bs, and a drain electrode (second drain electrode) 9Bd.

The oxide semiconductor layer 6B may be formed of the same oxide semiconductor film as the oxide semiconductor layer 6A of the first TFT 100. Likewise, the gate electrode 8B may be formed by using the same conductive film (for example, in the gate metal layer) as the gate electrode 8A of the first TFT 100. The source electrode 9Bs and the drain electrode 9Bd may be formed by using the same conductive film (for example, in the source metal layer) as the source electrode 9As and the drain electrode 9Ad of the first TFT 100.

As with the first TFT 100, when viewed in the normal direction of the main surface of the substrate 1, the oxide semiconductor layer 6B has a channel region 62c that overlaps the gate electrode 8B, and first and second regions that flank the channel region 62c. The first region includes a source contact region 62s electrically connected to the source electrode 9Bs. The second region includes a drain contact region 62d electrically connected to the drain electrode 9Bd.

The lower electrode 3B is positioned between the substrate 1 and the first insulating layer 5. The lower electrode 3B includes a region (referred to as an "overlapping region") 32 that overlaps the channel region 62c when viewed in the normal direction of the substrate 1.

The lower electrode 3B has a light-transmitting portion 32t that can transmit light in the thickness direction. The light-transmitting portion 32t includes a first transparent conductive film t1 that has a light-transmitting property, but does not include a light-shielding conductive film (such as a metal film). The light-transmitting portion 32t overlaps at least a portion of the channel region 61c when viewed in the normal direction of the substrate 1. In other words, the overlapping region 32 of the lower electrode 3B includes the light-transmitting portion 32t at least partly. The light-transmitting portion 32t may overlap the entirety of the channel region 61c when viewed in the normal direction of the substrate 1. By forming the light-transmitting portion 32t in the lower electrode 3B, light (backlight light) from the substrate 1 side can pass through the light-transmitting portion 32t and enter the channel region 62c. Thus, the plus shift of the threshold voltage can be suppressed by utilizing the minus shift effect caused by the photo deterioration.

In the example illustrated in the drawings, the lower electrode 3B is a transparent electrode that includes only a transparent conductive layer (here, the first transparent conductive film t1). In other words, the entirety of the lower electrode 3B is the light-transmitting portion 32t. As described below, the lower electrode 3B may partly include a metal film (for example, the first metal film m1). In such a case, when viewed in the normal direction of the substrate 1, a portion of the lower electrode 3B not including the first metal film m1 serves as the light-transmitting portion 32t.

The lower electrode 3B may function as a lower gate electrode of the second TFT 200. For example, the lower electrode 3B may be electrically connected to the gate electrode 8B. The mobility of the second TFT 200 can be more effectively improved by allowing the lower electrode 3B to function as a lower gate electrode. In such a case, the lower electrode 3B (lower gate electrode) may overlap the entirety of the channel region 62c when viewed in the normal direction of the substrate 1. In this manner, the mobility of the second TFT 200 can be further increased. Alternatively, the lower electrode 3B may be fixed to the fixed potential (for example, a source potential) or may be in an electrically floating state.

As with the first TFT 100, the second TFT 200 has a gate electrode 8B disposed on a portion of the oxide semiconductor layer 6B with the gate insulating layer 7B therebetween. The interlayer insulating layer 10 extends on the gate electrode 8B, and a source electrode 9Bs and a drain electrode 9Bd are disposed on the interlayer insulating layer 10. The interlayer insulating layer 10 has, formed therein, a source opening p3 that exposes the source contact region 62s and a drain opening p4 that exposes the drain contact region 62d. The source electrode 9Bs is connected to the source contact region 62s of the oxide semiconductor layer 6B in the source opening p3. The drain electrode 9Bd is connected to the drain contact region 62d of the oxide semiconductor layer 6B in the drain opening p4.

Wires that Use First Metal Film m1

In the active matrix substrate 1000, the first metal film m1 can be used to form not only the lower electrode 3A but also various other electrodes and wires (the wires constituting peripheral circuits such as gate drivers, wires for routing, etc.). These electrodes and wires may be metal wires formed solely of the first metal film m1, or may be multilayer wires that include the first metal film m1 and the first transparent conductive film t1.

For example, when a particular driving signal is applied to the lower electrode 3B or the lower electrode 3B is fixed to a particular potential, the lower electrode 3B is electrically connected to the wire formed of the first metal film m1. The lower electrode 3B may be a portion of such a wire. In such a case, a portion of the wire that serves as the light-transmitting portion 32t of the lower electrode 3B is to be transparent, and other portions may include a metal material (for example, the first metal film m1) that has low resistance.

Figure 3A:
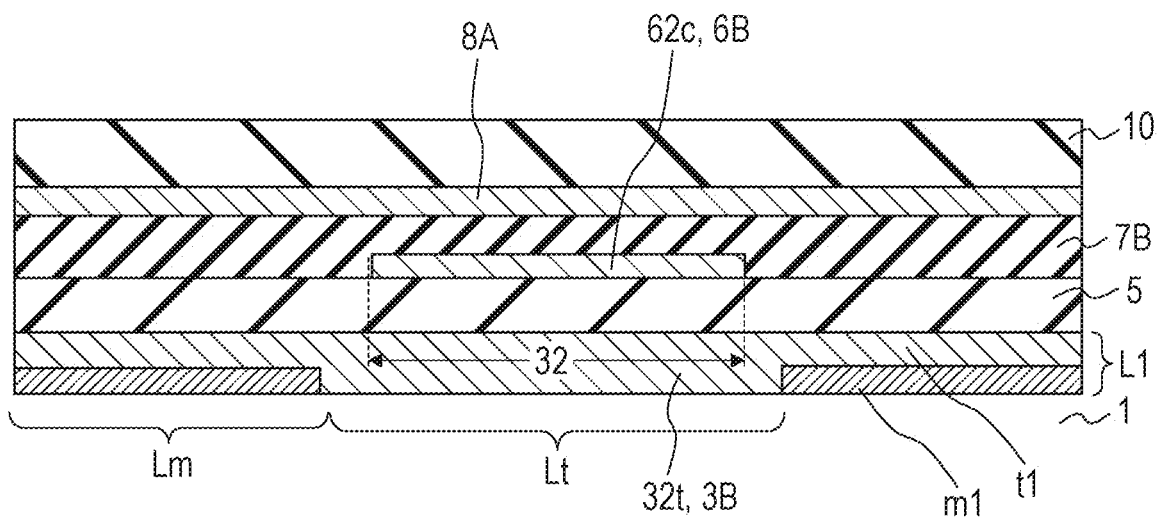
FIG. 3A is a diagram illustrating one example of a cross-sectional structure taken along line IIIA-IIIA in FIG. 2A.
Figure 3B:
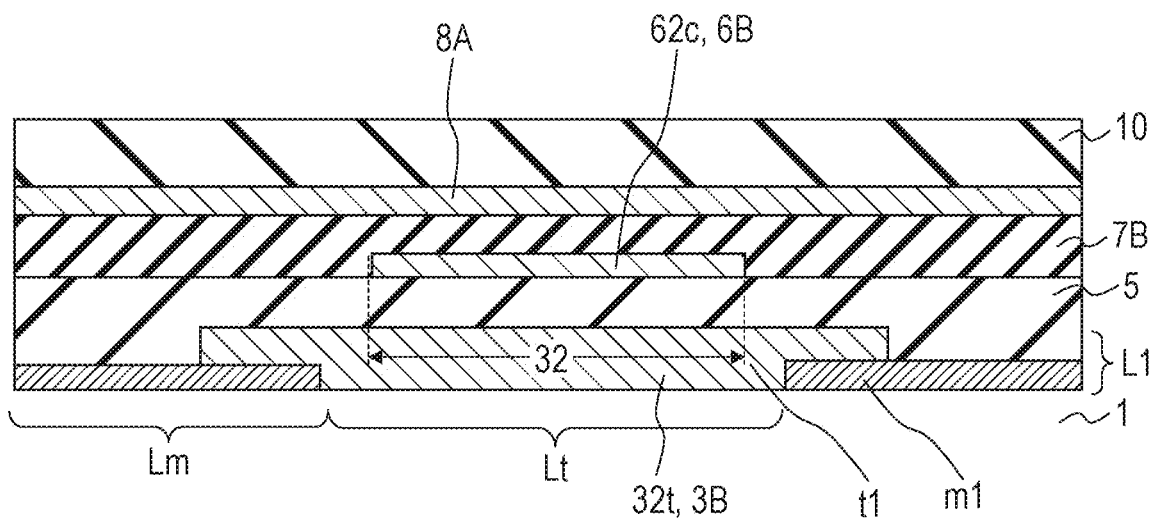
FIG. 3B is a diagram illustrating another example of a cross-sectional structure taken along line IIIB-IIIB in FIG. 2A.

FIGS. 3A and 3B are cross-sectional views (cross-sectional views taken in the channel width direction) taken at line IIIA-IIIA and line IIIB-IIIB in the second TFT 200.

The lower electrode 3B is electrically connected to a wire L1. In the example illustrated in FIG. 3A, the wire L1 is a multilayer wire that includes the first metal film m1 and the first transparent conductive film t1. Alternatively, as illustrated in FIG. 3B, the wire L1 may be a metal wire that includes the first metal film m1.

The lower electrode 3B can be considered as one portion of the wire L1. In other words, when viewed in the normal direction of the substrate 1, a portion of the wire L1 that does not overlap the channel region 62c may have a low-resistance portion Lm that includes the first metal film m1, and a portion that overlaps the channel region 62c may have a high-resistance portion Lt that includes the first transparent conductive film t1 but not the first metal film m1. A portion or the entirety of the high-resistance portion Lt functions as the light-transmitting portion 32t of the lower electrode 3B.

Although not illustrated in the drawing, the lower electrode 3A of the first TFT 100 can also be connected to a wire that includes the first metal film m1. Alternatively, the lower electrode 3A may be a portion of a wire that includes the first metal film m1. In such a case, a portion of such a wire that overlaps the channel region 61c when viewed in the normal direction of the substrate 1 functions as a light-shielding portion 31m.

Effects

According to this embodiment, for each of the multiple oxide semiconductor TFTs formed on the active matrix substrate, the TFT structure can be optimized according to the usage and the required characteristics. Thus, deterioration of the characteristics (shifts of the threshold voltage) of the TFTs can be suppressed according to the deterioration phenomena thereof. As a result, variation in the characteristics caused by deterioration among the TFTs can be decreased, and thus a highly reliable active matrix substrate is obtained.

Specifically, in some of TFTs (first TFTs) 100 among the multiple oxide semiconductor TFTs, a lower electrode 3A that can function as a light-shielding layer is formed on the substrate 1 side of the oxide semiconductor layer 6A (light-shielding structure). As a result, the amount of light (backlight light) incident on the channel region 61c of the oxide semiconductor layer 6A can be reduced, and thus, excessive minus shift of the threshold voltage can be suppressed.

Thus, reliability can be increased while securing the desired TFT characteristics. The light-shielding structure can be desirably employed in a low TFT in which the duty ratio of the driving signal applied to the gate is relatively low. This is because, in a TFT having a low duty ratio (large OFF-duty), the minus shift of the threshold voltage caused by application of minus bias stress is large. For example, a light-shielding structure may be employed in a TFT in which the duty ratio of the driving signal supplied to the gate is about less than 10% or less than 5%, for example, about less than 1%.

As one example, a light-shielding structure may be employed in a pixel TFT (duty ratio of driving signal: for example, about less than 1%). A pixel TFT is to have a small off-leakage current. This is because when the off-leakage current is large, the characteristic of retaining the potential written on the pixel electrode is deteriorated, and display failures such as luminance unevenness and flickers may occur. When a pixel TFT has a light-shielding structure, the minus shift of the threshold voltage caused by photo deterioration can be suppressed, and thus the increase in off-leakage current can be suppressed.

Meanwhile, in other TFTs (second TFTs) 200 among the multiple oxide semiconductor TFTs, a lower electrode 3B that includes a light-transmitting portion 32t is formed on the substrate 1 side of the oxide semiconductor layer 6B (non-light-shielding structure). In a non-light-shielding structure, part of the backlight light passes through the light-transmitting portion 32t and enters the oxide semiconductor layer 6B. By thus causing a minus shift of the threshold voltage by photo deterioration, the plus shift of the threshold voltage during application of the plus bias stress (application of a plus bias to the gate) can be suppressed and the reliability can be improved. The non-light-shielding structure can be desirably employed in a TFT in which the on-duty ratio of the driving signal is relatively high. This is because, in a TFT having a high duty ratio (large on-duty), the plus shift of the threshold voltage caused by application of plus bias stress is large. For example, a non-light-shielding structure may be employed in a TFT in which the duty ratio of the driving signal supplied to the gate is about 5% or more and preferably about 10% or more.

As one example, a non-light-shielding structure may be employed in a SSD circuit TFT (duty ratio of driving signal: for example, about 33% (varies depending on the value of n described below)). A SSD circuit TFT requires high ON-state current. When a SSD circuit TFT has a non-light-shielding structure, the shift amount of the threshold voltage toward the plus side can be decreased, and thus the decrease in ON-state characteristics caused by deterioration can be suppressed. In addition, the mobility can be further improved by allowing the oxide semiconductor layer 6B to function as a lower gate electrode.

According to the non-light-shielding structure, the off-leakage current sometimes increases due to the threshold voltage minus shift effect. Thus, the non-light-shielding structure may be employed in a TFT for the usage with which off-leakage is less likely to be an issue. For example, the increase in off-leakage current does not pose much problem on a SSD circuit TFT compared to a pixel TFT since, with the SSD circuit TFT, the time the TFT should remain OFF during one horizontal scan period (1H) is as short as about several μs, the amount of charges charged in advance is notably larger than that of a pixel TFT, and the potential difference Vds with respect to the site where the leakage is headed is relatively small (larger than 0 but not larger than the source amplitude voltage).

Moreover, according to this embodiment, by changing the lower electrode structure, TFTs having light-shielding structures and TFTs having non-light-shielding structures can be separately formed. Thus, it is possible to employ a simple process to separately form TFTs having optimum TFT structures, with which deterioration of characteristics can be suppressed, according to the usage and the duty ratio.

Modification Examples

Hereinafter, modification examples of the active matrix substrate of this embodiment are described with reference to the drawings. In the drawings hereinafter, constitutional elements similar to those illustrated in FIGS. 2A to 3B are denoted by the same reference signs.

The descriptions of similar features may be omitted as appropriate.

Modification Example 1

Figure 4A:
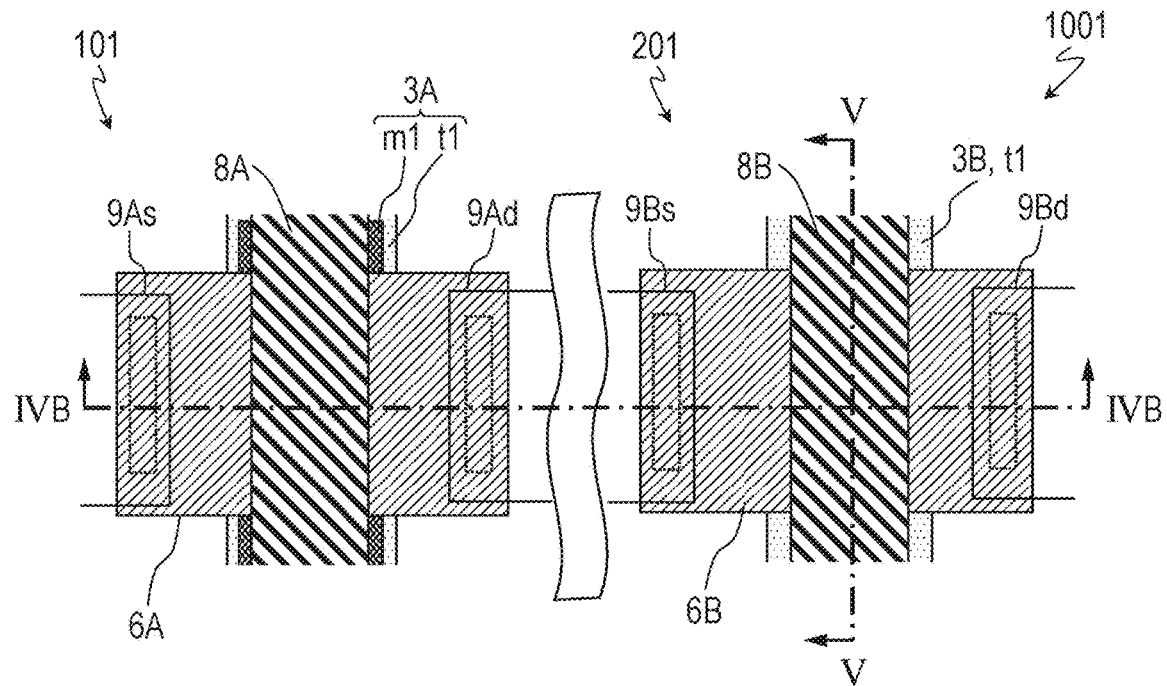
FIG. 4A is a plan view illustrating, as an example, a first TFT and a second TFT of an active matrix substrate according to modification example 1.
Figure 4B:
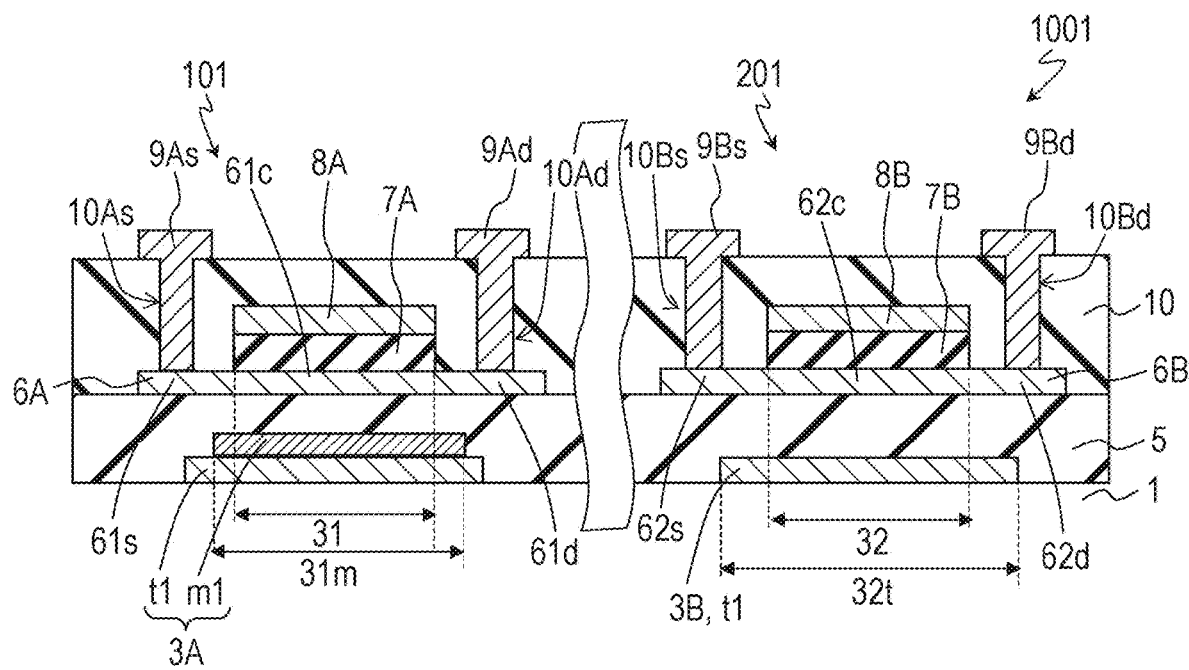
FIG. 4B is a cross-sectional view taken along line IVB-IVB in FIG. 4A.
Figure 5:
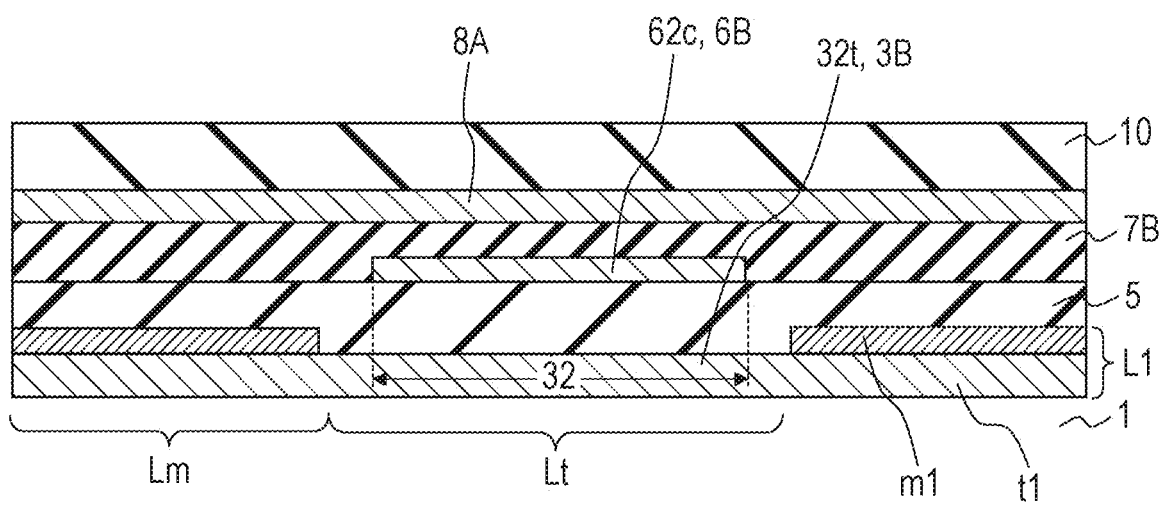
FIG. 5 is a diagram illustrating one example of a cross-sectional structure taken along line V-V in FIG. 4A.

FIG. 4A is a plan view illustrating a first TFT 101 and a second TFT 201 of an active matrix substrate 1001 according to modification example 1. FIG. 4B is a cross-sectional view taken along line IVB-IVB in FIG. 4A. Furthermore, FIG. 5 is a cross-sectional view taken along line V-V in FIG. 4A.

The first TFT 101 of modification example 1 differs from the first TFT 100 illustrated in FIGS. 2A and 2B in that, in the lower electrode 3A, the first metal film m1 is disposed on the first transparent conductive film t1. In this modification example also, as with the first TFT 100, the first metal film m1 that serves as a light-shielding portion 31m is arranged to overlap the entire channel region 61c when viewed in the normal direction of the substrate 1. Other features are the same as those of the first TFT 100.

Meanwhile, the second TFT 201 has the same structure as the second TFT 200 illustrated in FIGS. 2A and 2B.

The active matrix substrate 1001 of this modification example may also further include wires that use the first metal film m1. As illustrated in FIG. 5, the lower electrode 3B of the second TFT 201 may be a portion of the wire L1. The wire L1 is a multilayer wire that includes the first transparent conductive film t1 and the first metal film m1 disposed on the first transparent conductive film t1, and a portion of the wire L1 that overlaps the channel region 62c of the second TFT 201 does not have to include the first metal film m1. Alternatively, although not illustrated in the drawings, the wire L1 may be a metal wire that includes the first metal film m1.

Modification Example 2

Figure 6A:
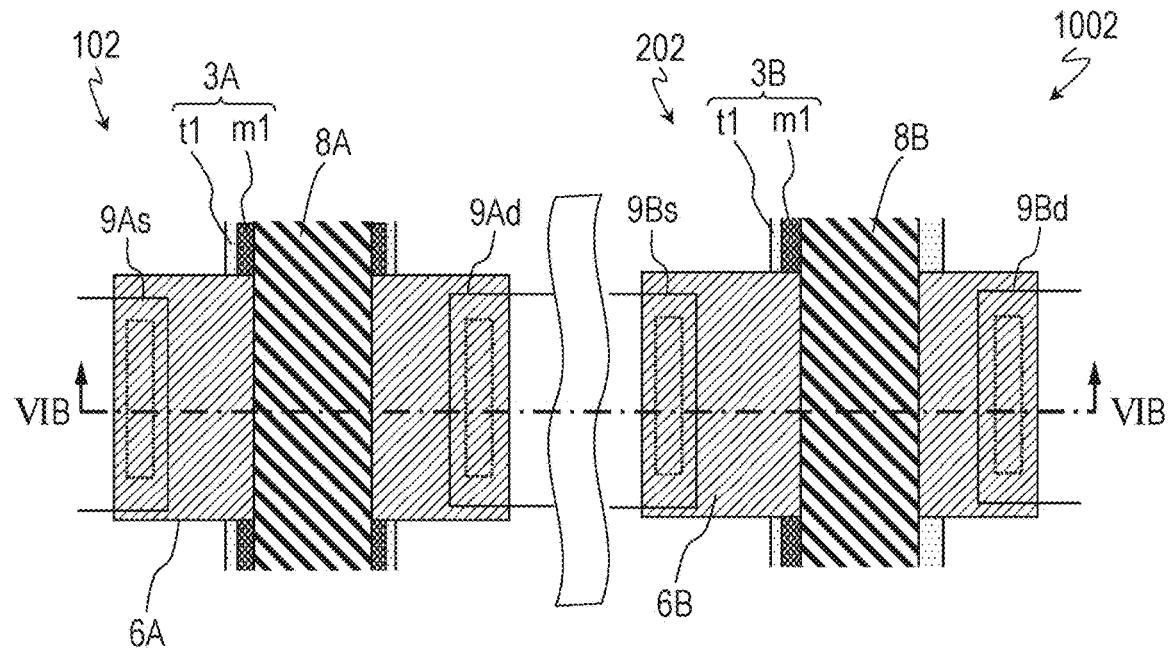
FIG. 6A is a plan view illustrating, as an example, a first TFT and a second TFT of an active matrix substrate according to modification example 2.
Figure 6B:
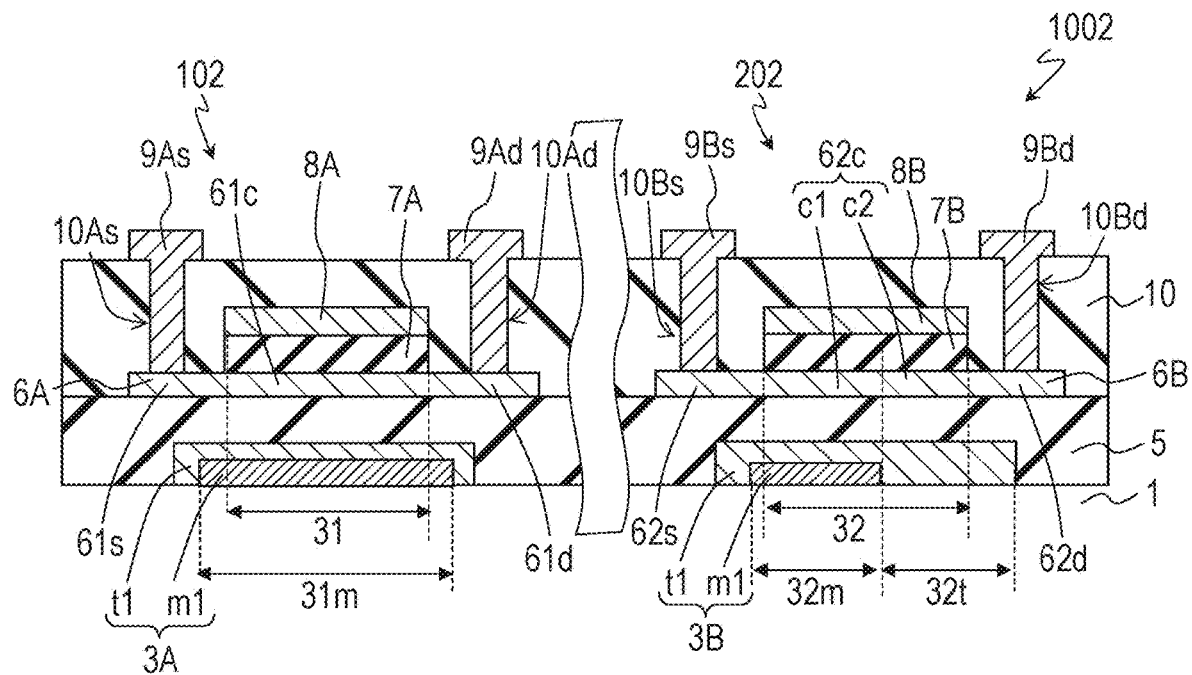
FIG. 6B is a cross-sectional view taken along line VIB-VIB in FIG. 6A.

FIG. 6A is a plan view illustrating a first TFT 102 and a second TFT 202 of an active matrix substrate 1002 according to modification example 2. FIG. 6B is a cross-sectional view taken along line VIB-VIB' in FIG. 6A.

The first TFT 102 of modification example 2 has the same structure as the first TFT 100 illustrated in FIGS. 2A and 2B.

In the second TFT 202, the lower electrode 3B is configured to partly shield the channel region 62c from light so that light is incident only on one portion of the channel region 62c. In other words, according to this modification example, the lower electrode 3B has a light-transmitting portion 32t that overlaps only a portion of the channel region 62c when viewed in the normal direction of the substrate 1. The features of the second TFT 202 other than the lower electrode 3B are the same as those of the second TFT 200. In this description, of non-light-shielding structures, a structure that has a light-transmitting portion 32t that overlaps the entire channel region 62c as with the second TFT 200 illustrated in FIGS. 2A and 2B is referred to as a "first non-light-shielding structure", and a structure that has a light-transmitting portion 32t that overlaps only a portion of the channel region 62c as with this modification example is referred to as a "second non-light-shielding structure".

The lower electrode 3B has a multilayer structure that includes a first transparent conductive film t1 and a first metal film m1. When viewed in the normal direction of the substrate 1, the lower electrode 3B includes a light-shielding portion (may also be referred to as a "second light-shielding portion") 32m that includes the first metal film m1, and a light-transmitting portion 32t that includes the first transparent conductive film t1 but not the first metal film m1. The first metal film m1 may be formed of the same first metal film as the first metal film m1, and the first transparent conductive film t1 may be formed of the same first transparent conductive film as the first transparent conductive film t1. The light-transmitting portion 32t is to overlap at least a portion of the channel region 62c when viewed in the normal direction of the substrate 1.

The light-transmitting portion 32t may overlap a portion of the channel region 62c, and the light-shielding portion 32m may overlap another part of the channel region 62c. In other words, in the lower electrode 3B, the overlapping region 32 overlapping the channel region 61c when viewed in the normal direction of the substrate 1 may include the light-transmitting portion 32t and the light-shielding portion 32m. By providing the light-shielding portion 32m in the overlapping region 32 of the lower electrode 3B, the channel region 61c can be partly shielded from light. According to such a structure, the amount light incident on the channel region 61c can be adjusted by adjusting the area ratios of the light-transmitting portion 32t and the light-shielding portion 32m. Thus, the minus shift effect during application of the minus bias can be controlled according to the usage of the TFT and the driving signal.

The lower electrode 3B (the entire lower electrode including the light-transmitting portion 32t and the light-shielding portion 32m) may overlap the entire channel region 61c when viewed in the normal direction of the substrate 1. In this manner, the lower electrode 3B functions as a lower gate electrode, and thus the TFT performance (mobility) can be increased.

Note that, when the lower electrode is solely constituted by a light-shielding portion that partly shields the channel region from light, the area of the lower electrode that also functions as a lower gate electrode decreases relative to the channel region, and the mobility may not be sufficiently increased in some cases. To address this, in this modification example, the light-transmitting portion 32t is arranged to overlap the portion of the channel region 62c not shielded from light when viewed in the normal direction of the substrate 1, and, thus, a lower electrode 3B that has a sufficient area relative to the area of the channel region 62c can be formed while shielding only one portion of the channel region 62c from light.

When viewed in the normal direction of the substrate 1, the channel region 62c includes a light-shielded portion c1 overlapping the light-shielding portion 32m of the lower electrode 3B, and an irradiated portion c2 overlapping the light-transmitting portion 32t of the lower electrode 3B. The area ratio (%) of the light-shielded portion c1 relative to the entire channel region 62c is not particularly limited and may be, for example, about 25% or more and 75% or less.

Note that although FIGS. 6A and 6B illustrate an example in which the first transparent conductive film t1 is formed on the first metal film m1, the first metal film m1 may be formed on the first transparent conductive film t1. In such a case, in the lower electrodes 3A and 3B, the first metal film m1 is disposed on the first transparent conductive film t1 (refer to FIG. 4B).

An active matrix substrate 1002 of this modification example may be further equipped with, in addition to the aforementioned first TFT 102 and second TFT 202, the second TFT 200 illustrated in FIGS. 2A and 2B. For example, a first non-light-shielding structure that allows light to enter the entire channel region may be employed in a TFT to which a driving signal having a first duty ratio is supplied (second TFT 200), a second non-light-shielding structure that allows light to enter only a portion of the channel region may be employed in a TFT to which a driving signal having a second duty ratio lower than the first duty ratio is supplied (second TFT 202), and a light-shielding structure that shields the entire channel region from light may be employed in a TFT to which a driving signal having a third duty ratio lower than the second duty ratio is supplied (first TFT 102).

Modification Example 3

Figure 7A:
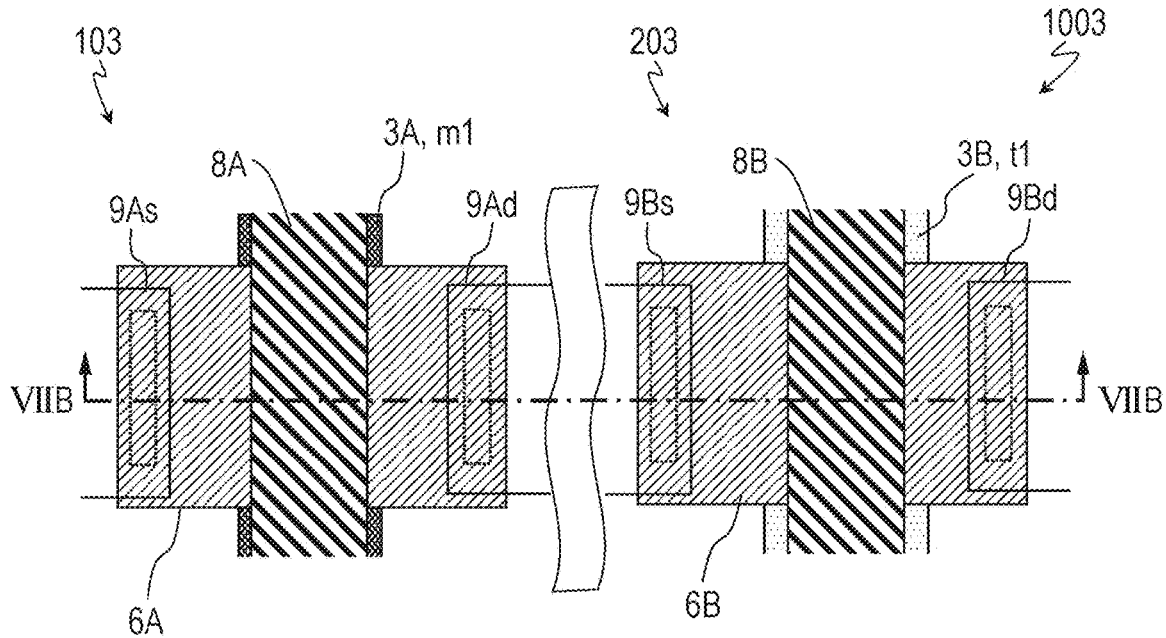
FIG. 7A is a plan view illustrating, as an example, a first TFT and a second TFT of an active matrix substrate according to modification example 3.
Figure 7B:
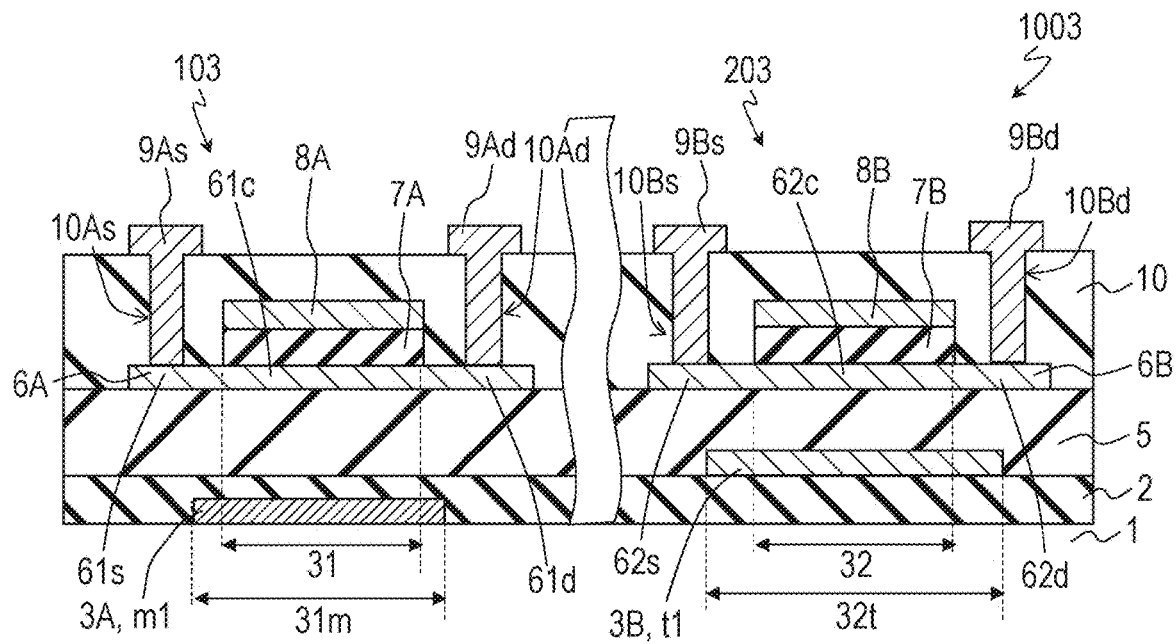
FIG. 7B is a cross-sectional view taken along line VIIB-VIIB in FIG. 7A.

FIG. 7A is a plan view illustrating a first TFT 103 and a second TFT 203 of an active matrix substrate 1003 according to modification example 3. FIG. 7B is a cross-sectional view taken along line VIIB-VIIB in FIG. 7A.

The active matrix substrate 1003 of modification example 3 further has a second insulating layer 2 between the first insulating layer 5 and the substrate 1. The material for the second insulating layer 2 may be the same as or different from that for the first insulating layer 5.

In the first TFT 103, the first metal film m1 is disposed between the substrate 1 and the second insulating layer 2. The lower electrode 3A includes a first metal film m1 formed of the first metal film. The first metal film m1 (light-shielding portion 31*m*) overlaps the entirety of the channel region 61*c* when viewed in the normal direction of the substrate 1. In the example illustrated in the drawings, the lower electrode 3A is a metal electrode formed of a metal film, and does not have to include a transparent conductive film.

In the first TFT 103, both the second insulating layer 2 and the first insulating layer 5 are present between the oxide semiconductor layer 6A and the lower electrode 3A. Thus, when the lower electrode 3A is used as the lower gate electrode, the second insulating layer 2 and the first insulating layer 5 function as the lower gate insulating film.

Meanwhile, the second TFT 203 has the same structure as the second TFT 200 illustrated in FIGS. 2A and 2B. In other words, the lower electrode 3B is disposed between the second insulating layer 2 and the first insulating layer 5. The lower electrode 3B includes a first transparent conductive film t1 formed of the first transparent conductive film. In the example illustrated in the drawings, the lower electrode 3B is a transparent electrode constituted by a transparent conductive film. Note that, in this modification example also, at least a portion of the overlapping region 32 of the lower electrode 3B is to be a light-transmitting portion 32*t* that includes the first transparent conductive film t1.

In the second TFT 203, the first insulating layer 5 is positioned between the oxide semiconductor layer 6B and the lower electrode 3B, but the second insulating layer 2 is not. Thus, when the lower electrode 3B is used as the lower gate electrode, only the first insulating layer 5 functions as the lower gate insulating film.

According to this modification example, the thickness of the lower gate insulating film can be independently controlled for each of the TFTs. For example, since the lower gate insulating film (first insulating layer 5) of the second TFT 203 can be made thinner, the mobility of the second TFT 203 can be further improved. Since the resistance of the lower gate electrode (lower electrode 3B) of the second TFT 203 may be high, the dielectric strength between the lower electrode 3B and the oxide semiconductor layer 6B can be securely obtained despite the reduced thickness of the first insulating layer 5. Furthermore, since, in the first TFT 103, the thickness of the lower gate insulating film is the total thickness of the first insulating layer 5 and the second insulating layer 2, the dielectric strength can be securely obtained between the lower electrode 3A and the oxide semiconductor layer 6A by adjusting the thickness of the second insulating layer 2.

Although not illustrated in the drawings, in this modification example also, the first metal film m1 can be used as wires. For example, the lower electrode 3B may be electrically connected to the wire formed from the first metal film m1. In such a case, the lower electrode 3B and the wire formed of the first metal film m1 may be directly connected to each other in an opening formed in the second insulating layer 2. Alternatively, the lower electrode 3B and the wire may be connected via another conductive film formed in a different layer, such as a source metal layer.

Figure 8:
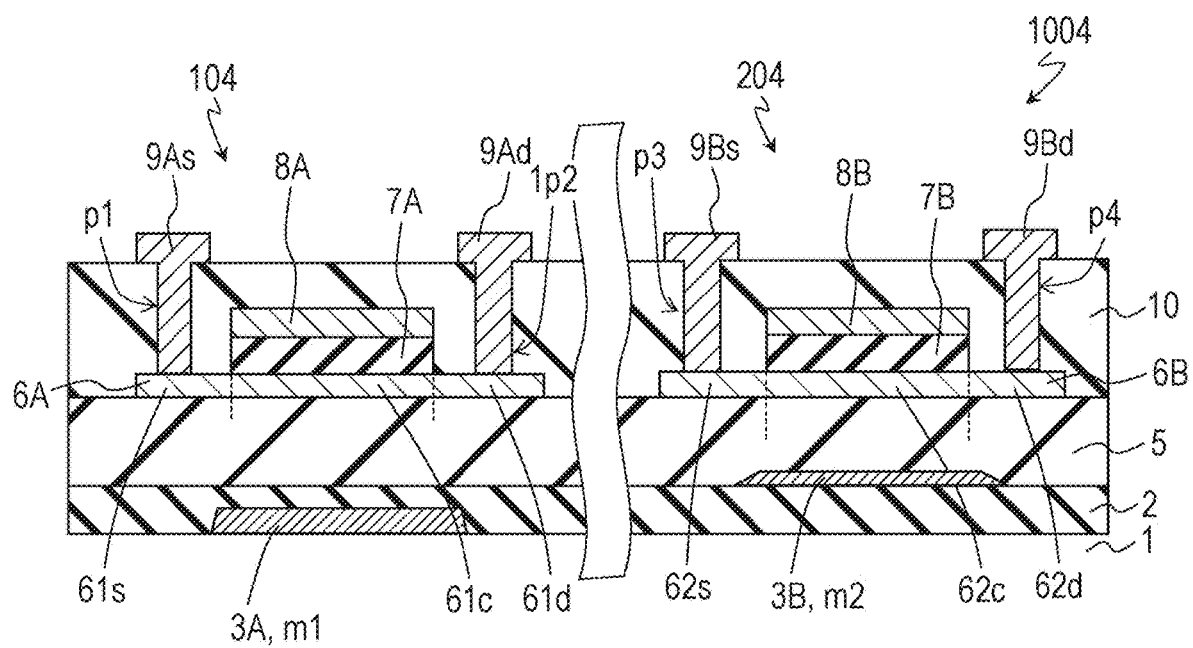
FIG. 8 is a cross-sectional view illustrating, as an example, a first TFT and a second TFT of an active matrix substrate according to modification example 4.

FIG. 8 is a cross-sectional view illustrating a first TFT 104 and a second TFT 204 of a yet another active matrix substrate 1004.

The active matrix substrate 1004 is different in that the lower electrode 3B of the first TFT 104 is formed from a second metal film m2 unlike the first TFT 103 illustrated in FIGS. 7A and 7B. The metal material for the second metal film m2 may be the same as or different from that for the first metal film m1. In this modification example also, as with the active matrix substrate 1003, the thickness of the lower gate insulating film can be independently controlled for each of the TFTs.

In this example, the lower electrode 3B has a better tapered shape than the lower electrode 3A. In other words, the slope of a side surface (end surface) of the lower electrode 3B is more gentle than that of a side surface of the lower electrode 3A. In order to form the lower electrode 3B having such a tapered shape, for example, the second metal film m2 may be formed to be thinner than the first metal film m1.

When the tapered shape of the lower electrode 3B is gentle, the first insulating layer 5 that covers the lower electrode 3B takes a smooth form that reflects the surface profile of the lower electrode 3B, and thus defects rarely occur in the first insulating layer 5. Thus, even when the first insulating layer 5 is made thinner, a higher insulating property can be securely obtained. Thus, by making the first insulating layer 5 thinner, the mobility of the second TFT 204 can be further increased while the dielectric strength between the lower electrode 3B and the oxide semiconductor layer 6B is securely obtained. Meanwhile, in the first TFT 104, the dielectric strength can be securely obtained between the lower electrode 3A and the oxide semiconductor layer 6A by adjusting the thickness of the second insulating layer 2.

As long as the metal materials for the first metal film m1 and the second metal film m2 are the same, for example, the tapered shape of the lower electrode 3B can be made more gentle than the lower electrode 3A by making the second metal film m2 thinner than the first metal film m1. When the metal materials for the first metal film m1 and the second metal film m2 are different from each other, the materials for the metal films, the thickness, the etching method, the etching conditions, etc., may be adjusted so that a satisfactory tapered shape is formed by the lower electrode 3B.

Application Examples of Active Matrix Substrate

In this embodiment, the first TFT includes, for example, a pixel TFT, and the second TFT includes, for example, a circuit TFT. One pixel TFT is provided for each of multiple pixel regions PIX. The circuit TFT is disposed in the non-display region and constitutes a peripheral circuit.

In the description below, an active matrix substrate applied to a FFS-mode display device is taken as an example in more specifically describing the structure of each TFT. The FFS mode is a horizontal field mode with which a pair of electrodes are installed on one of the substrates, and an electric field is applied to liquid crystal molecules in a direction parallel to the substrate surface (horizontal direction). Note that the active matrix substrate of this embodiment may be applied to a display device of a vertical field mode (for example, a TN mode or a vertical alignment mode) in which voltage is applied in the thickness direction of the liquid crystal layer.

Figure 9:
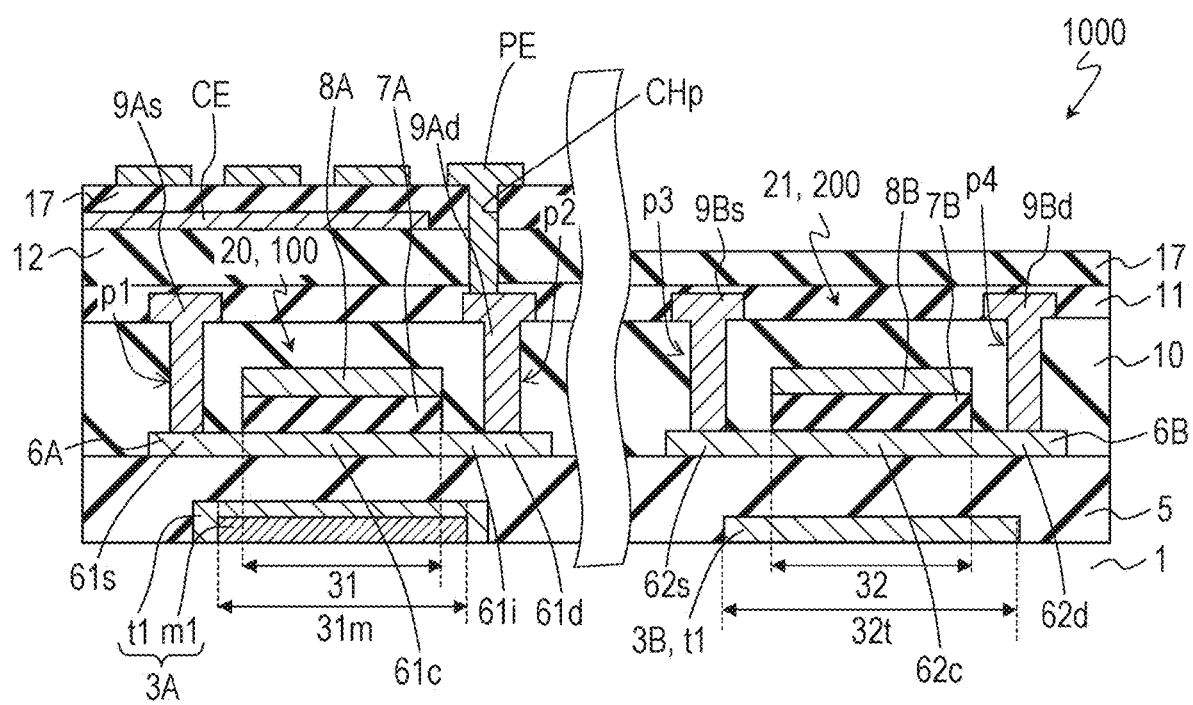
FIG. 9 is a cross-sectional view illustrating, as an example, a pixel TFT and a SSD circuit TFT of the active matrix substrate.
Figure 10:
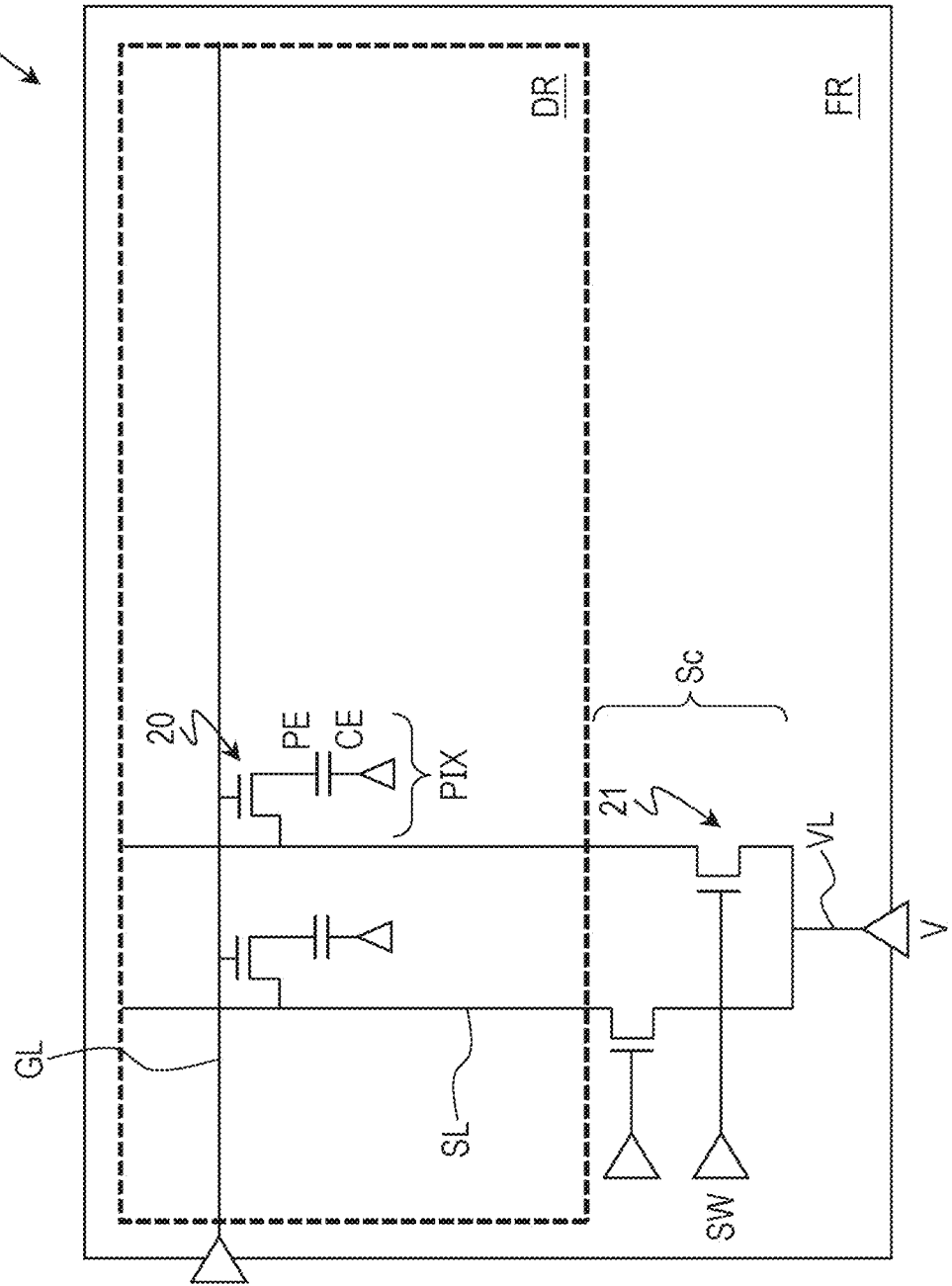
FIG. 10 is a plan view illustrating, as an example, the active matrix substrate that includes the pixel TFT and the SSD circuit TFT.

FIG. 9 is a cross-sectional view illustrating, as an example, a pixel TFT 20 and a circuit TFT (here, a SSD circuit TFT) 21 of the active matrix substrate 1000. Furthermore, FIG. 10 is a diagram illustrating one part of a circuit that includes the pixel TFT 20 and the SSD circuit TFT 21 in the active matrix substrate 1000. Although the active matrix substrate 1000 has multiple pixel TFTs and multiple SSD circuit TFTs, here, only one pixel TFT 20 and one SSD circuit TFT 21 are illustrated in the drawing.

The pixel TFT 20 is disposed in each of the pixel region PIX in the display region DR. The pixel TFT 20 has a light-shielding structure. In the example illustrated in FIG. 9, the pixel TFT 20 is a first TFT 100 illustrated in FIGS. 2A and 2B, but, alternatively, may be any one of the first TFTs of modification examples. Here, the detailed descriptions of the TFT structure are omitted.

In the pixel TFT 20, the source contact region 61s of the oxide semiconductor layer 6A is electrically connected to a corresponding source bus line SL via a source electrode 9As. The drain contact region 61d is electrically connected to the pixel electrode PE via the drain electrode 9Ad.

The gate electrode 8A is electrically connected to the gate bus line GL. The gate electrode 8A may be integrally formed with (connected with) the gate bus line GL. For example, the gate electrode 8A may be a portion of the gate bus line GL. In such a case, of the gate bus line GL, the portion overlapping the oxide semiconductor layer 6A when viewed in the normal direction of the substrate 1 may be referred to as a "gate electrode 8A".

The source electrode 9As may be integrally formed with (connected with) the source bus line SL. For example, the source electrode 9As may be a portion of the source bus line SL.

An upper insulating layer 13 is formed on the source metal layer so as to cover the pixel TFT 20. The upper insulating layer 13 includes, for example, an inorganic insulating layer (for example, a passivation film) 11. As illustrated in the drawing, the upper insulating layer 13 may have a multilayer structure that includes the inorganic insulating layer 11 and an organic insulating layer 12 formed on the inorganic insulating layer 11. Note that the organic insulating layer 12 need not be formed. Alternatively, the organic insulating layer 12 may be formed only in the display region.

A common electrode CE is formed on the upper insulating layer 13. The common electrode CE does not have to be separated for each of the pixel regions PIX. For example, the common electrode CE may have an opening in the pixel contact region (a region where a pixel contact hole CHp is formed) where the pixel electrode PE and the drain electrode 9Ad are connected, and may be formed over the entire pixel region PIX other than the pixel contact region.

The pixel electrode PE is disposed on the common electrode CE with a dielectric layer 17 therebetween. The pixel electrode PE is separated for each of the pixel regions PIX. In each of the pixel regions PIX, one or multiple slits (openings) or cutouts are formed in the pixel electrode PE.

The pixel electrode PE is disposed on the dielectric layer 17, and is connected to the drain electrode 9Ad in the pixel contact hole CHp formed in the upper insulating layer 13 and the dielectric layer 17.

Note that, in the example illustrated in the drawing, the pixel electrode PE is disposed on the common electrode CE with the dielectric layer 17 therebetween; however, the common electrode CE may be formed on the pixel electrode PE with the dielectric layer 17 therebetween. In such a case, in each of the pixel regions PIX, a slit or a cutout is formed in the common electrode CE.

In addition, in the pixel TFT 20, a drain electrode need not be included in the source metal layer. For example, the pixel electrode PE may be directly connected to the drain contact region 61d of the oxide semiconductor layer 6A. In other words, a portion of the pixel electrode PE that is in contact with the drain contact region 61d may function as a drain electrode.

Furthermore, although not illustrated in the drawings, the source bus line SL and the source electrode 9As of the pixel TFT 20 may be formed by using the first metal film m1 (in other words, may be formed in the same layer as the lower electrode 3A). Such a substrate structure in which the source bus line SL is arranged on the substrate 1 side with respect to the gate metal layer and the oxide semiconductor layer 6A is referred to as a "lower source structure".

The SSD circuit TFT 21 constitutes a SSD circuit Sc disposed in the non-display region FR. In FIG. 10, only one unit circuit that constitutes the SSD circuit Sc is illustrated. In this example, the unit circuit includes two SSD circuit TFTs 21 (n=2). The structure of the SSD circuit is described below.

The SSD circuit TFT 21 has a non-light-shielding structure. In the example illustrated in FIG. 9, the SSD circuit TFT 21 is the second TFT 200 illustrated in FIGS. 2A and 2B. Alternatively, the SSD circuit TFT 21 may be any one of the second TFTs of modification examples. The SSD circuit TFT 21 may be covered with the inorganic insulating layer 11 and the dielectric layer 17. Here, the detailed descriptions of the TFT structure are omitted.

A source electrode 9Bs of the SSD circuit TFT 21 is electrically connected to a signal output line VL to which a video signal V is supplied, and a drain electrode 9Bd is electrically connected to the corresponding source bus line SL. A SSD control signal SW is supplied to a gate electrode 8B of the SSD circuit TFT 21.

Structure and Operation of SSD Circuit

Figure 11:
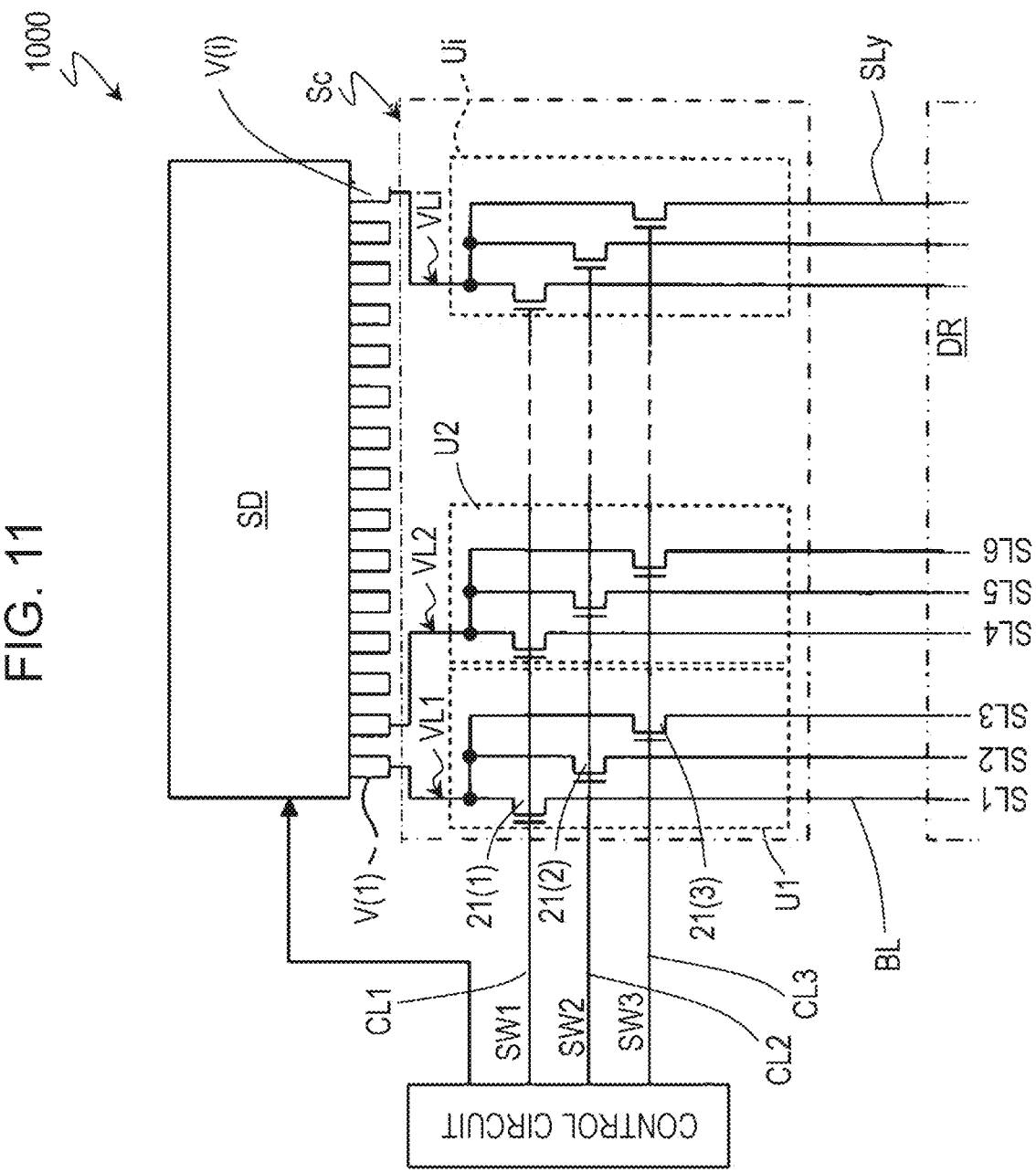
FIG. 11 is a diagram illustrating the structure and operation of a SSD circuit Sc.

FIG. 11 is a diagram illustrating the structure and operation of the SSD circuit Sc of the active matrix substrate 1000 of this embodiment. Note that FIG. 11 is an example, and the structure of the SSD circuit Sc is not limited to the one illustrated in the drawing.

The SSD circuit Sc is disposed between the source driver SD and the display region DR. The SSD circuit Sc includes multiple SSD circuit TFTs 21.

The SSD circuit Sc includes multiple circuits U1 to Ui (hereinafter, collectively referred to as the "unit circuits U") supported on the substrate 1. Each of the multiple unit circuits U distributes display signals to n source bus lines SL (n is an integer of 2 or more) from one signal output line VL. FIG. 11 illustrates the case in which n=3, in other words, the case in which each of the unit circuits U distributes display signals to three source bus lines SL from one signal output line VL.

Each unit circuit U includes n (3 here) branch lines BL and n (3 here) SSD circuit TFTs 21 (in the unit circuit U1, TFTs 21(1), 21(2), and 21(3)). Three branch lines BL are connected to one signal output line VL. In addition, three TFTs 21 are respectively connected to three branch lines BL. In these TFTs 21, the electrical connections between the three branch lines BL and three source bus lines SL (SL1 to SL3 in the unit circuit U1) are individually (independently) subjected to on-off control.

Hereinafter, the structure of each of the unit circuits U is more specifically described by taking the unit circuit U1 as an example.

The unit circuit U1 distributes a display signal V(1) from the signal output line VL1 to source bus lines SL1 to SL3.

A source electrode and a drain electrode of the TFT 21 in the unit circuit U1 are respectively connected to the corresponding branch line BL and source bus line SL, and the electrical connection between the corresponding branch line BL and source bus line SL are subjected to on-off control.

The SSD circuit Sc has n (3 here) control signal feeders CL1 to CL3 (collectively referred to as "control signal feeders CL"). The control signal feeders CL are connected to a control circuit disposed in the non-display region FR.

To the gate electrode of the TFT 21(1), a selection signal (SSD control signal) SW1 is supplied from the control signal feeder CL1, and, to the gate electrode of the TFT 21C, a SSD control signal SW2 is supplied from the control signal feeder (second control signal feeder) CL2. These SSD control signals define the ON-state period of the selection switch in the same group, and is synchronized with the time-series signal output from the source driver SD. These unit circuits U sequentially write the data potential, which is obtained by time-sharing of the output from the signal output line VL, into the corresponding three source bus lines SL in a time-sharing manner (time-shared driving).

In the example illustrated in the drawing, each unit circuit U is arranged with respect to three source bus lines SL (for example, three source bus lines coordinated to the R, G, and B pixels) (n=3). In such a case, a SSD control signal (driving signal) SW that has a high duty ratio of about 33% is applied to each of the gate electrodes of the three TFTs 21 in each unit circuit U.

Note that the SSD circuit Sc of this embodiment is not limited to the structure described as an example above and can have various structures. Although n is not particularly limited, n is, for example, 2 or more and 6 or less and is preferably 2 or 3. The duty ratio of the SSD control signal SW can vary depending on the value of n and the absence/presence of the in-cell touch panel. For example, when n=2, a SSD control signal (driving signal) SW that has a high duty ratio of about 50% is applied to each of the gate electrodes of two TFTs 21 in each unit circuit U (refer to FIG. 10). Moreover, when the active matrix substrate 1000 is equipped with an in-cell touch panel, the duty ratio of the SSD control signal may decrease, for example, to about half.

In this description, the entire contents of the disclosures of Japanese Unexamined Patent Application Publication Nos. 2008-225036 and 2006-119404 and the international publication No. 2011/118079 regarding the operation of the display device that uses the SSD circuit Sc, the timing chart of the time-shared driving, etc., are incorporated in this description by reference.

EXAMPLES

The inventors of the present disclosure have studied the effects of applying a non-light-shielding structure to a SSD circuit TFT, and the procedure and results thereof will now be described.

First, as Example, an active matrix substrate equipped with a SSD circuit TFT having a lower electrode formed of a transparent conductive film was prepared. In addition, as Comparative Example, an active matrix substrate equipped with a SSD circuit TFT having a lower electrode formed of a metal film was prepared. The active matrix substrates of Example and Comparative Example are identical in structure except for the SSD circuit TFT.

Figure 13A:
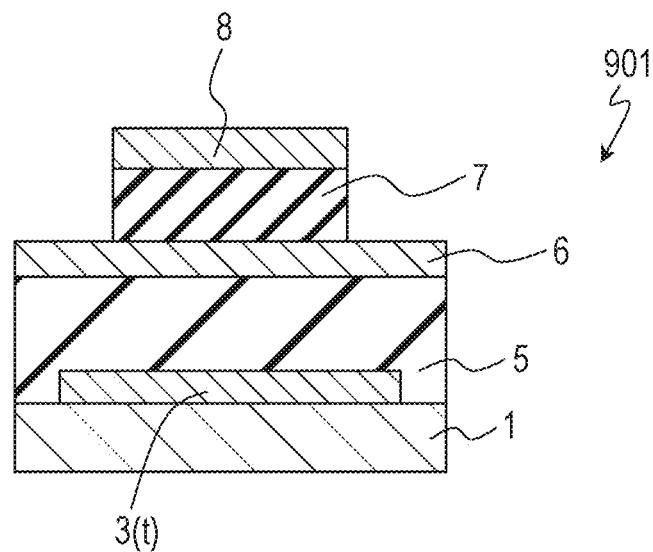
FIG. 13A is a cross-sectional view illustrating a TFT used as a SSD circuit TFT of an active matrix substrate of Example.
Figure 13B:
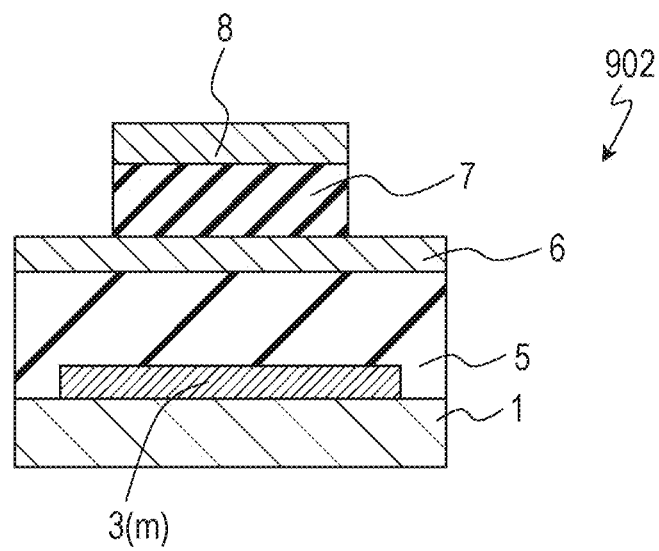
FIG. 13B is a cross-sectional view illustrating a TFT used as a SSD circuit TFT of an active matrix substrate of Comparative Example.

FIGS. 13A and 13B are, respectively, cross-sectional views illustrating SSD circuit TFTs 901 and 902 of Example and Comparative Example. The SSD circuit TFT 901 of Example is equipped with a transparent lower electrode 3(*t*) disposed on a substrate 1, an oxide semiconductor layer 6, a gate insulating layer 7, a gate electrode 8, and source and drain electrodes not illustrated in the drawing. Here, an In—Ga—Zn—O semiconductor layer is used as the oxide semiconductor layer 6. The lower electrode 3(*t*) is a transparent electrode formed of an indium-tin oxide film (thickness: about 50 nm). The SSD circuit TFT 902 of Comparative Example has a lower electrode 3(*m*) that has a light-shielding property. The lower electrode 3(*m*) is a metal electrode formed of a Cu/Ti film (thickness: about 230 nm). The SSD circuit TFT 902 has a structure identical to the SSD circuit TFT 901 except for the material of the lower electrode.

Next, display panels that used active matrix substrates of Example and Comparative Example were subjected to an aging test involving about 1000 hours of driving in a high-temperature environment (temperature: about 70° C.) to study changes in characteristics of the SSD circuit TFTs 901 and 902 by the aging test. The duty ratio of the driving signal applied to the SSD circuit TFTs 901 and 902 was set to about 33% in the aging test. Here, the Vg-Id characteristics of the SSD circuit TFTs 901 and 902 before and after the aging test were measured, and the shift amount ΔVth of the threshold voltage Vth toward the plus side was determined.

Figure 14:
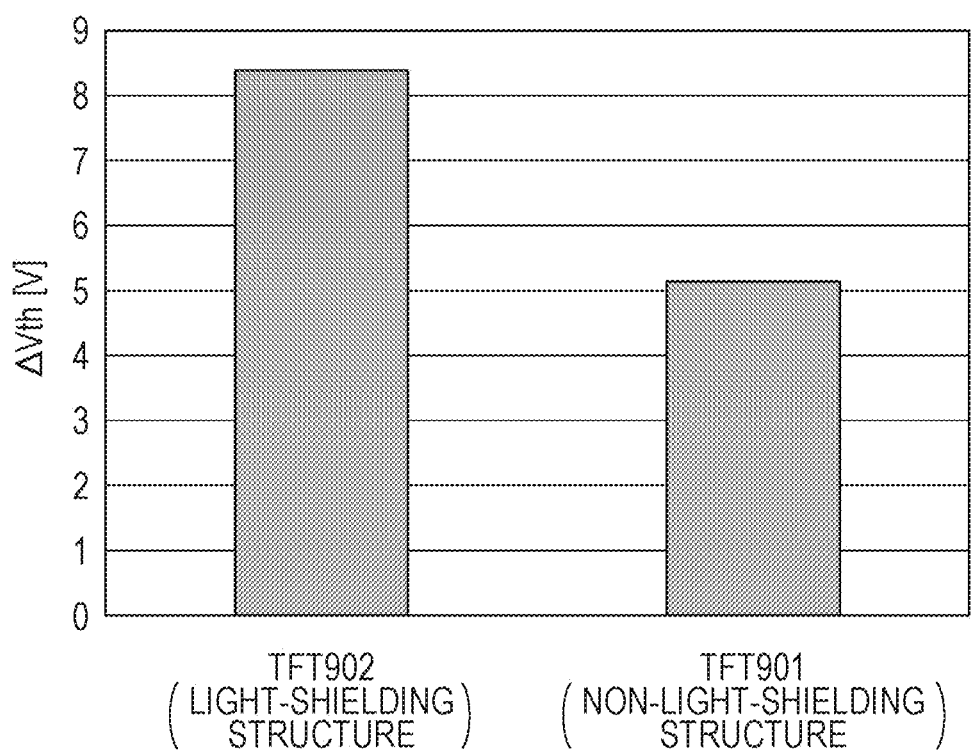
FIG. 14 is a graph indicating the shift amount ΔVth of threshold voltage caused by gate bias stress in the TFTs.

FIG. 14 is a graph showing the shift amounts ΔVth of the SSD circuit TFTs 901 and 902 of Example and Comparative Example. As illustrated in the graph, the shift amount ΔVth of the SSD circuit TFT 901 of Example decreased notably from the shift amount ΔVth of the SSD circuit TFT 902 of Comparative Example. Thus, this shows that, according to the active matrix substrate of Example, the lifetime of the SSD circuit TFT can be extended.

It can be confirmed from the aforementioned results that, by using a transparent electrode as a lower electrode of a SSD circuit TFT, the plus shift of the threshold voltage Vth can be suppressed compared to when a lower electrode having a light-shielding property is used. The lower electrode of the SSD circuit TFT is not limited to a transparent electrode, and the same effect can be obtained as long as there is a light-transmitting portion that overlaps the channel region when viewed in the normal direction of the substrate.

Method for Producing Active Matrix Substrate 1001

Next, one example of a method for producing an active matrix substrate according to this embodiment is described with reference to the drawings. Here, a method for producing a first TFT 100 that serves as a pixel TFT 20 and a second TFT 200 that serves as a SSD circuit TFT 21 illustrated in FIG. 9 is describes as an example.

FIG. 15 is a chart illustrating the process flow of one example of a method for producing an active matrix substrate 1001.

Step 1: Forming Lower Electrodes 3A and 3B

A first metal film (thickness: for example, about 50 nm or more and 500 nm or less) m1 is formed on a substrate 1 by, for example, a sputtering method. Next, the first metal film m1 is patterned (for example, wet-etched) by a known photolithographic process. Next, a first transparent conductive film t1 (thickness: for example, about 30 nm or more and 300 nm or less) is formed, and the first transparent conductive film patterned (for example, wet-etched) by a known photolithographic process. As a result, a lower electrode 3A that includes the first metal film m1 and the first transparent conductive film t1 and a transparent lower electrode 3B that includes the first transparent conductive film t1 are formed.

As the substrate 1, a transparent and insulating substrate, for example, a glass substrate, a silicon substrate, a heat-resistant plastic substrate (resin substrate), or the like can be used.

The material for the first metal film is not particularly limited, and a film that contains a metal, such as aluminum (Al), tungsten (W), molybdenum (Mo), tantalum (Ta), chromium (Cr), titanium (Ti), or copper (Cu), an alloy thereof, or a metal nitride thereof can be used as appropriate. In addition, a multilayer film obtained by stacking more than one of these films may be used. Here, as the first metal film, a multilayer film (Cu/Ti film) that includes a Ti film (thickness: about 30 nm) and a Cu film (thickness: about 200 nm) arranged in this order from the substrate 1 side is used.

The material for the first transparent conductive film is not particularly limited, and a metal oxide such as indium-zinc oxide, indium-tin oxide (ITO), or ZnO can be used. Here, as the first transparent conductive film, indium-tin oxide (ITO) (thickness: about 50 nm) formed by a sputtering method is used.

Step 2: Forming First Insulating Layer 5

Next, a first insulating layer 5 (thickness: for example, about 200 nm or more and 600 nm or less) is formed so as to cover the lower electrode 3A and the lower electrode 3B.

The first insulating layer 5 is formed by, for example, a CVD method. As the first insulating layer 5, a silicon oxide (SiOx) layer, a silicon nitride (SiNx) layer, a silicon oxynitride (SiOxNy; x>y) layer, a silicon nitride oxide (SiNxOy; x>y) layer, or the like can be used as appropriate. The first insulating layer 5 may be a single layer or have a multilayer structure. For example, a silicon nitride (SiNx) layer, a silicon nitride oxide layer, or the like may be formed on the substrate side (lower layer) to prevent diffusion of impurities from the substrate 1 and the like, and then a silicon oxide (SiO$_2$) layer, a silicon oxynitride layer, or the like may be formed as a layer thereabove (upper layer) to securely obtain an insulating property. Here, as the first insulating layer 5, a multilayer film in which a silicon nitride (SiNx) layer (thickness: about 50 to 600 nm) is a lower layer and a silicon oxide (SiO$_2$) layer (thickness: about 50 to 600 nm) is an upper layer may be formed. When an oxide film such as a silicon oxide film is used as the first insulating layer 5 (when the first insulating layer 5 has a multilayer structure, the uppermost layer thereof), the oxidation defects that occur in the channel region of a subsequently formed oxide semiconductor layer can be decreased by the oxide film, and thus the decrease in resistance of the channel region can be suppressed.

Step 3: Forming Oxide Semiconductor Layers 6A and 6B

Next, an oxide semiconductor film is formed on the first insulating layer 5. Subsequently, the oxide semiconductor film may be annealed. The thickness of the oxide semiconductor film may be, for example, about 15 nm or more and 200 nm or less.

Next, the oxide semiconductor film is patterned by a known photolithographic process. Patterning of the oxide semiconductor film may involve wet etching that uses a PAN etching solution that contains phosphoric acid, nitric acid, and acetic acid, or an oxalic acid etching solution. In this manner, oxide semiconductor layers 6A and 6B that serve as active layers of the first TFT 100 and the second TFT 200 are obtained.

The oxide semiconductor films can be formed by, for example, a sputtering method. Here, an In—Ga—Zn—O semiconductor film (thickness: about 50 nm) film that contains In, Ga, and Zn is formed as an oxide semiconductor film.

Step 4: Forming Gate Insulating Layer and Gate Metal Layer

Next, a gate insulating film (thickness: for example, about 80 nm or more and 250 nm or less) and a gate conductive film (thickness: for example, about 50 nm or more and 500 nm or less) are formed in this order so as to cover the oxide semiconductor layers 6A and 6B.

An insulating film (an insulating film described as one example of the first insulating layer 5) similar to the first insulating layer 5 can be used as the gate insulating film. Here, as the gate insulating film, a silicon oxide (SiO$_2$) layer is formed. When an oxide film such as a silicon oxide film is used as an insulating film, the oxidation defects generated in the channel regions of the oxide semiconductor layers 6A and 6B can be decreased by the oxide film, and thus the decrease in resistance of the channel region can be suppressed.

As the gate conductive film, for example, a metal such as molybdenum (Mo), tungsten (W), aluminum (Al), copper (Cu), titanium (Ti), or tantalum (Ta), or an alloy thereof can be used. The gate conductive film may have a multilayer structure that includes multiple layers formed of different conductive materials. Here, as a gate conductive film, a Cu/Ti multilayer film in which a Ti film is a lower layer and a Cu film is an upper layer, or a Cu/Mo multilayer film in which a Mo film is a lower layer and a Cu film is an upper layer is used.

Subsequently, a resist layer is formed on the gate conductive film, and the gate conductive film is patterned by using the resist layer as a mask so as to form a gate metal layer that includes a gate electrode 8A, a gate electrode 8B, and a gate bus line GL. Next, the gate insulating film is etched by using the resist layer or the gate metal layer as a mask so as to obtain a gate insulating layer 7A and a gate insulating layer 7B. In this manner, a region of the oxide semiconductor layer 6A that overlaps the gate electrode 8A with the gate insulating layer 7A therebetween serves as a channel region 61c. A region of the oxide semiconductor layer 6B that overlaps the gate electrode 8B with the gate insulating layer 7B therebetween serves as a channel region 62c.

Step 5: Resistance-Decreasing Process and Forming Interlayer Insulating Layer 10

Next, a resistance-decreasing process may be performed on the oxide semiconductor layer 6A and the oxide semiconductor layer 6B. As the resistance-decreasing process, for example, a plasma process may be performed. As a result, when viewed in the normal direction of the substrate 1, exposed regions of the oxide semiconductor layers 6A and 6B on the two sides of the channel regions 61c and 62c serve as low-resistance regions where the specific resistivity is lower than the channel regions 61c and 62c. The low-resistance regions may be conductor regions (for example, sheet resistance: about 200Ω/□ or less).

Next, an interlayer insulating layer 10 that covers the oxide semiconductor layers 6A and 6B, the gate insulating layers 7A and 7B, and the gate metal layer is formed. As the interlayer insulating layer 10, an inorganic insulating layer such as a silicon oxide film, a silicon nitride film, a silicon oxynitride film, or a silicon nitride oxide film can be formed as a single layer or by stacking these films. The inorganic insulating layer may have a thickness of about 100 nm or more and 500 nm or less. The interlayer insulating layer 10 may be formed by using an insulating film, such as a silicon nitride film, that reduces an oxide semiconductor, since the specific resistivity of regions of the oxide semiconductor layers 6A and 6B that contact the interlayer insulating layer 10 can be maintained at a low level. Here, as the interlayer insulating layer 10, a multilayer film in which a SiO$_2$ layer is a lower layer and a SiNx layer is an upper layer is formed by, for example, a CVD method.

Subsequently, the interlayer insulating layer 10 is patterned by, for example, dry etching. As a result, openings p1 to p4 that respectively expose portions 61s and 61d of the oxide semiconductor layer 6A and portions 62s and 62d of the oxide semiconductor layer 6B are formed in the interlayer insulating layer 10.

Step 6: Forming Source Metal Layer

Next, a source conductive film (thickness: for example, about 50 nm or more and 500 nm or less) is formed on the interlayer insulating layer 10, and the source conductive film is patterned. As a result, an upper metal layer that includes a source electrode 9As, a drain electrode 9Ad, a source electrode 9Bs, a drain electrode 9Bd, and source bus lines SL is formed. Thus, the first TFT 100 and the second TFT 200 are produced.

As a source conductive film, an element selected from aluminum (Al), chromium (Cr), copper (Cu), tantalum (Ta), titanium (Ti), molybdenum (Mo), and tungsten (W) or an alloy that contains these elements as components can be used, for example. For example, a titanium film-aluminum film-titanium film three-layer structure or a molybdenum film-aluminum film-molybdenum film three-layer structure may be formed. Here, a multilayer film in which a Ti film (thickness: about 15 to 70 nm) is a lower layer and a Cu film (thickness: about 200 to 400 nm) is an upper layer is used.

Step 7: Forming Inorganic Insulating Layer 11 and Organic Insulating Layer 12

Next, an upper insulating layer 13 is formed so as to cover the interlayer insulating layer 10 and the source metal layer. Here, as the upper insulating layer 13, an inorganic insulating layer 11 (thickness: for example, about 100 nm or more and 500 nm or less) and an organic insulating layer 12 (thickness: for example, about 1 to 3 μm and preferably about 2 to 3 μm) are formed in this order. Note that, of the organic insulating layer 12, the entire portion positioned in the non-display region may be removed. Alternatively, the organic insulating layer 12 need not be formed.

As the inorganic insulating layer 11, the inorganic insulating film (an insulating film described as one example of the interlayer insulating layer 10) similar to the interlayer insulating layer 10 can be used. Here, as the inorganic insulating layer 11, a SiNx layer (thickness: about 300 nm) is formed by, for example, a CVD method. The organic insulating layer 12 may be, for example, an organic insulating film (for example, an acryl resin film) containing a photosensitive resin material.

Subsequently, the organic insulating layer 12 is patterned. As a result, a first opening that exposes a portion of the inorganic insulating layer 11 is formed in the organic insulating layer 12 in each of the pixel regions PIX. The first opening is arranged to overlap the drain electrode 9Ad of the first TFT 100 that serves as a pixel TFT when viewed in the normal direction of the substrate 1.

Step 8: Forming Common Electrode Ce

Next, a common electrode CE is formed on the upper insulating layer 13.

First, a lower transparent conductive film (thickness: about 20 to 300 nm) not illustrated in the drawing is formed on the upper insulating layer 13 and in the first opening. Here, for example, an indium-zinc oxide film is formed as the lower transparent conductive film by, for example, a sputtering method. A metal oxide such as indium-tin oxide (ITO), indium-zinc oxide, or ZnO can be used as the material for the first transparent electrode film. Subsequently, the lower transparent conductive film is patterned. Patterning may involve, for example, wet etching that uses an oxalic acid etching solution. As a result, a common electrode CE is obtained. For example, the common electrode CE may be disposed substantially throughout the entirety of the display region other than the pixel contact hole-forming regions where pixel contact holes CHp are to be formed.

Step 9: Forming Dielectric Layer 17

Next, a dielectric layer (thickness: about 50 to 500 nm) 17 is formed so as to cover the common electrode CE, and the dielectric layer 17 and the inorganic insulating layer 11 are patterned.

In the pixel region PIX, the dielectric layer 17 is formed on the organic insulating layer 12 and the common electrode CE and in the first opening. The material for the dielectric layer 17 may be the same as the material described as an example of the material for the inorganic insulating layer 11. Here, as the dielectric layer 17, a SiN film is formed by, for example, a CVD method.

Subsequently, a resist layer (not illustrated) is formed on the dielectric layer 17 by a photolithographic process. The dielectric layer 17 and the inorganic insulating layer 11 are etched (for example, dry-etched) by using the resist layer and the organic insulating layer 12 as a mask. The dielectric layer 17 and the inorganic insulating layer 11 may be etched in the same etching process. As a result, in the pixel region, a pixel contact hole CHp that exposes a portion of the drain contact region 61d of the oxide semiconductor layer 6A is formed. The pixel contact hole CHp is constituted by an opening formed in the inorganic insulating layer 11, a first opening in the organic insulating layer 12, and an opening in the dielectric layer 17.

Step 10: Forming Pixel Electrode PE

Next, an upper transparent conductive film (thickness: about 20 to 300 nm) not illustrated in the drawing is formed on the dielectric layer 17 and in the pixel contact hole CHp. The material for the upper transparent conductive film may be the same (for example, ITO) as the material described as an example of the material for the upper transparent conductive film.

Subsequently, the upper transparent conductive film is patterned. For example, the upper transparent conductive film may be wet-etched by using an oxalic acid etching solution. As a result, a pixel electrode PE is obtained. The pixel electrode PE in the pixel region PIX is formed on the dielectric layer 17 and in the pixel contact hole CHp, and is connected to the drain electrode 9Ad of the pixel TFT in the pixel contact hole CHp. As a result, an active matrix substrate 1000 is produced.

The active matrix substrates 1001 and 1002 of modification examples 1 and 2 can be produced by methods similar to that described above. However, for the active matrix substrate 1001 of modification example 1, in STEP 1, the first metal film m1 is formed and patterned after the first transparent conductive film t1 is formed and patterned.

For the active matrix substrate 1003 of modification example 3, in STEP 1, the first metal film m1 is formed and patterned, the lower electrode 3A is formed, and then the second insulating layer 2 (thickness: for example, about 50 nm or more and 600 nm or less) is formed so as to cover the lower electrode 3A.

As the second insulating layer 2, an insulating film (an insulating film described as one example of the first insulating layer 5) similar to the first insulating layer 5 can be used. The material for the second insulating layer 2 may be the same as or different from that for the first insulating layer 5. For example, a SiN layer (thickness: for example, about 150 nm) may be formed as the second insulating layer 2, and a $SiO_2$ layer (thickness: for example, about 150 nm) may be formed as the first insulating layer 5. The electric field strength from the lower electrode can be changed between two TFTs by changing the thickness of the insulating layer interposed between the lower electrode and the channel region. Thus, the thickness of the insulating layer optimum for each TFT in view of element deterioration and mobility can be selected. The thickness of the second insulating layer 2 is not particularly limited and may be smaller than that of the first insulating layer 5. Subsequently, a first transparent conductive film t1 is formed on the second insulating layer 2, and patterned to obtain a lower electrode 3B. The steps thereafter are the same as those described above.

The active matrix substrate 1004 of modification example 4 can be produced by a method similar to that for the active matrix substrate 1003. However, the second metal film m2 is used instead of the first transparent conductive film t1. The material for the second metal film m2 may be the same as or different from that of the first metal film m1. For example, a Cu/Ti film (thickness: for example, about 230 nm) may be formed as the first metal film m1, and a Mo film (thickness: for example, about 50 nm) may be formed as the second metal film m2.

Oxide Semiconductor

The oxide semiconductor (may also be referred to as a metal oxide or an oxide material) contained in the oxide semiconductor layer of each TFT of this embodiment may be an amorphous oxide semiconductor or a crystalline oxide semiconductor that has a crystalline portion. Examples of the crystalline oxide semiconductor include polycrystalline oxide semiconductors, microcrystalline oxide semiconductors, and crystalline oxide semiconductors having a c-axis oriented substantially perpendicular to the layer surface.

The oxide semiconductor layer may have a multilayer structure having two or more layers. When the oxide semiconductor layer has a multilayer structure, the oxide semiconductor layer may include an amorphous oxide semiconductor layer and a crystalline oxide semiconductor layer. Alternatively, multiple crystalline oxide semiconductor layers having different crystal structures may be included. Alternatively, multiple amorphous oxide semiconductor layers may be included. When the oxide semiconductor layer has a two-layer structure including an upper layer and a lower layer, the energy gap of the oxide semiconductor contained in the layer positioned on the gate electrode side (the lower layer if in the bottom gate structure and the upper layer if in the top gate structure) among the two layers may be smaller than the energy gap of the oxide semiconductor contained in the layer (the upper layer if in the bottom gate structure and the lower layer if in the top gate structure) positioned on the opposite side of the gate electrode. However, when the difference in energy gap between these layers is relatively small, the energy gap of the oxide semiconductor in the layer positioned on the gate electrode side may be larger than the energy gap of the oxide semiconductor in the layer positioned on the opposite side of the gate electrode.

The materials, structures, and deposition methods of the amorphous oxide semiconductor and the aforementioned crystalline oxide semiconductors, and the structure of the oxide semiconductor layer having a multilayer structure are, for example, described in Japanese Unexamined Patent Application Publication No. 2014-007399. For reference, the entire contents of the disclosure of the Japanese Unexamined Patent Application Publication No. 2014-007399 are incorporated herein by reference.

The oxide semiconductor layer may contain, for example, at least one metal element selected from In, Ga, and Zn. In this embodiment, the oxide semiconductor layer contains, for example, an In—Ga—Zn—O semiconductor (for example, indium gallium zinc oxide). Here, the In—Ga—Zn—O semiconductor is a tertiary oxide of indium (In), gallium (Ga), and zinc (Zn), and the ratio of In, Ga, and Zn (compositional ratio) is not particularly limited and includes, for example, In:Ga:Zn=2:2:1, In:Ga:Zn=1:1:1, In:Ga:Zn=1:1:2, or the like. Such an oxide semiconductor layer can be formed from an oxide semiconductor film containing an In—Ga—Zn—O semiconductor.

The In—Ga—Zn—O semiconductor may be amorphous or crystalline. The crystalline In—Ga—Zn—O semiconductor may be a crystalline In—Ga—Zn—O semiconductor having the c-axis oriented substantially perpendicular to the layer surface.

Note that the crystal structure of the crystalline In—Ga—Zn—O semiconductor is described in Japanese Unexamined Patent Application Publication Nos. 2014-007399, 2012-134475, and 2014-209727, etc., for example. For reference, the entire contents of the disclosures of the Japanese Unexamined Patent Application Publication Nos. 2012-134475 and 2014-209727 are incorporated herein by reference. A TFT having an In—Ga—Zn—O semiconductor layer has high mobility (more than twenty times that of a-Si TFTs) and a low leakage current (less than one hundredth of that of a-Si TFTs), and thus is suitable for use in a drive TFT (for example, a TFT included in a driving circuit formed in the periphery of the display region including multiple pixels and on the same substrate as the display region) and a pixel TFT (a TFT formed in a pixel).

The oxide semiconductor layer may contain a different oxide semiconductor instead of the In—Ga—Zn—O semiconductor. For example, an In—Sn—Zn—O semiconductor (for example, $In_2O_3$—$SnO_2$—ZnO; InSnZnO) may be contained. The In—Sn—Zn—O semiconductor is a tertiary oxide of indium (In), tin (Sn), and zinc (Zn). Alternatively, the oxide semiconductor layer may contain an In—Al—Zn—O semiconductor, an In—Al—Sn—Zn—O semiconductor, a Zn—O semiconductor, an In—Zn—O semiconductor, a Zn—Ti—O semiconductor, a Cd—Ge—O semiconductor, a Cd—Pb—O semiconductor, CdO (cadmium oxide), a Mg—Zn—O semiconductor, an In—Ga—Sn—O semiconductor, an In—Ga—O semiconductor, a Zr—In—Zn—O semiconductor, a Hf—In—Zn—O semiconductor, an Al—Ga—Zn—O semiconductor, a Ga—Zn—O semiconductor, an In—Ga—Zn—Sn—O semiconductor, an In—W—Zn—O semiconductor, or the like.

The embodiments of the present disclosure are applicable to an active matrix substrate that has a monolithically formed peripheral circuit. Such an active matrix substrate is applicable to various types of electronic devices including display devices such as a liquid crystal display device, an organic electroluminescence (EL) display device, and an inorganic electroluminescence display device, imaging devices such as an image sensor device, an image input device, a fingerprint reading device, and a semiconductor memory.

The present disclosure contains subject matter related to that disclosed in U.S. Provisional Patent Application No. 63-146291 filed in the U.S. Patent Office on Feb. 5, 2021, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An active matrix substrate comprising:
a substrate; and a plurality of oxide semiconductor TFTs supported on the substrate, wherein:

the plurality of oxide semiconductor TFTs include a plurality of first TFTs and a plurality of second TFTs, each of the first TFTs includes a first lower electrode, a first insulating layer that covers the first lower electrode, a first oxide semiconductor layer disposed on the first insulating layer, and a first gate electrode disposed on a portion of the first oxide semiconductor layer with a first gate insulating layer therebetween, in each of the first TFTs, the first oxide semiconductor layer includes a first channel region that overlaps the first gate electrode when viewed in a normal direction of the substrate, and the first lower electrode has a first light-shielding portion that overlaps an entirety of the first channel region when viewed in the normal direction of the substrate, and the first light-shielding portion includes a first metal film, each of the second TFTs includes a second lower electrode, the first insulating layer that is extended to cover the second lower electrode, a second oxide semiconductor layer disposed on the first insulating layer, and a second gate electrode disposed on a portion of the second oxide semiconductor layer with a second gate insulating layer therebetween, and in each of the second TFTs, the second oxide semiconductor layer includes a second channel region that overlaps the second gate electrode when viewed in the normal direction of the substrate, and the second lower electrode has a light-transmitting portion that overlaps at least a portion of the second channel region when viewed in the normal direction of the substrate, and the light-transmitting portion includes a first transparent conductive film but not a light-shielding metal film.

2. The active matrix substrate according to claim 1, wherein the first lower electrode of each of the first TFTs has a multilayer structure that includes the first metal film and the first transparent conductive film.

3. The active matrix substrate according to claim 2, wherein, in the first lower electrode of each of the first TFTs, the first transparent conductive film is disposed on the first metal film so as to cover a side surface and an upper surface of the first metal film.

4. The active matrix substrate according to claim 2, wherein, in the first lower electrode of each of the first TFTs, the first metal film is disposed on the first transparent conductive film.

5. The active matrix substrate according to claim 1, wherein, in the second lower electrode of each of the second TFTs, the light-transmitting portion overlaps an entirety of the second channel region when viewed in the normal direction of the substrate.

6. The active matrix substrate according to claim 1, wherein the second lower electrode of each of the second TFTs further includes a second light-shielding portion that includes the first metal film, and in the second lower electrode of each of the second TFTs, the light-transmitting portion overlaps only a portion of the second channel region and the second light-shielding portion overlaps another portion of the second channel region when viewed in the normal direction of the substrate.

7. The active matrix substrate according to claim 1, further comprising a second insulating layer between the first insulating layer and the substrate, wherein, in each of the first TFTs, the first lower electrode is disposed between the substrate and the second insulating layer, and the first insulating layer and the second insulating layer are positioned between the first oxide semiconductor layer and the first lower electrode, and in each of the second TFTs, the second lower electrode is disposed between the second insulating layer and the first insulating layer, and, although the first insulating layer is positioned between the second oxide semiconductor layer and the second lower electrode, the second insulating layer is not.

8. The active matrix substrate according to claim 1, wherein, in each of the second TFTs, the second lower electrode is electrically connected to the second gate electrode, and functions as a lower gate electrode of the second TFT.

9. The active matrix substrate according to claim 1, wherein, during driving of the active matrix substrate, a duty ratio of a driving signal applied to the second gate electrode of each of the second TFTs is higher than a duty ratio of a driving signal applied to the first gate electrode of each of the first TFTs.

10. The active matrix substrate according to claim 9, wherein, during driving of the active matrix substrate, the duty ratio of the driving signal applied to the first gate electrode of each of the first TFTs is less than 5%, and the duty ratio of the driving signal applied to the second gate electrode of each of the second TFTs is 10% or more.

11. The active matrix substrate according to claim 1, further comprising:

a display region that includes a plurality of pixel regions;

a non-display region that is positioned in a periphery of the display region and includes a circuit-forming region where a peripheral circuit is formed;

a plurality of source bus lines and a plurality of gate bus lines supported on the substrate;

a plurality of pixel TFTs each disposed in a corresponding one of the pixel regions; and a plurality of circuit TFTs that constitute the peripheral circuit, wherein a source electrode of each of the pixel TFTs is electrically connected to one of the plurality of source bus lines, and a gate electrode of each of the pixel TFTs is electrically connected to one of the plurality of gate bus lines, the plurality of first TFTs include the plurality of pixel TFTs, and the plurality of second TFTs include at least one of the plurality of circuit TFTs.

12. The active matrix substrate according to claim 11, wherein the peripheral circuit includes a SSD circuit that distributes a display signal to n source bus lines among the plurality of source bus lines, and the plurality of second TFTs include a plurality of SSD circuit TFTs that constitute the SSD circuit, and each of the SSD circuit TFTs supplies a video signal to a corresponding one of the n source bus lines.

13. The active matrix substrate according to claim 2, further comprising a wire that includes the first metal film, wherein the second lower electrode of each of the second TFTs is electrically connected to the wire.

14. The active matrix substrate according to claim 2, further comprising a wire that includes the first metal film and the first transparent conductive film, wherein, when viewed in the normal direction of the substrate, a portion of the wire that does not overlap the second lower electrode of each of the second TFTs has a low-resistance portion that includes the first metal film and the first transparent conductive film, a portion of the wire that overlaps the second channel region of each of the second TFTs includes a high-resistance portion that includes the first transparent conductive film but not the first metal film, and the high-resistance portion functions as the light-transmitting portion of the second lower electrode.

15. The active matrix substrate according to claim 1, wherein the first oxide semiconductor layer and the second oxide semiconductor layer contain an In—Ga—Zn—O semiconductor.

16. The active matrix substrate according to claim 15, wherein the In—Ga—Zn—O semiconductor includes a crystalline portion.

\* \* \* \* \*